United States Patent
Saito et al.

(10) Patent No.: US 8,310,862 B2
(45) Date of Patent: Nov. 13, 2012

(54) MAGNETORESISTIVE EFFECT ELEMENT AND MAGNETIC MEMORY

(75) Inventors: Yoshiaki Saito, Kawasaki (JP); Hideyuki Sugiyama, Yokohama (JP); Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 541 days.

(21) Appl. No.: 12/481,726

(22) Filed: Jun. 10, 2009

(65) Prior Publication Data

US 2009/0244960 A1 Oct. 1, 2009

Related U.S. Application Data

(62) Division of application No. 11/368,383, filed on Mar. 7, 2006, now abandoned.

(30) Foreign Application Priority Data

Jul. 6, 2005 (JP) ................................. 2005-197877

(51) Int. Cl.
*G11C 11/00* (2006.01)

(52) U.S. Cl. ........ 365/158; 365/148; 365/171; 365/172; 977/933; 977/935

(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 428/810–816, 817–825.1, 428/826; 483/3; 977/933–935

See application file for complete search history.

(56) References Cited

U.S. PATENT DOCUMENTS

| | | | |
|---|---|---|---|
| 6,256,223 B1 * | 7/2001 | Sun | 365/171 |
| 2005/0181226 A1 * | 8/2005 | Weidman et al. | 428/544 |
| 2005/0195532 A1 * | 9/2005 | Sugiyama et al. | 360/322 |
| 2005/0254286 A1 * | 11/2005 | Valet | 365/158 |

* cited by examiner

*Primary Examiner* — Alexander Sofocleous
*Assistant Examiner* — Harry W Byrne
(74) *Attorney, Agent, or Firm* — Oblon, Spivak, McClelland, Maier & Neustadt, L.L.P.

(57) ABSTRACT

It is made possible to provide a highly reliable magnetoresistive effect element and a magnetic memory that operate with low power consumption and current writing and without element destruction. The magnetoresistive effect element includes a first magnetization pinned layer comprising at least one magnetic layer and in which a magnetization direction is pinned, a magnetization free layer in which a magnetization direction is changeable, a tunnel barrier layer provided between the first magnetization pinned layer and the magnetization free layer, a non-magnetic metal layer provided on a first region in an opposite surface of the magnetization free layer from the tunnel barrier layer, a dielectric layer provided on a second region other than the first region in the opposite surface of the magnetization free layer from the tunnel barrier layer; and a second magnetization pinned layer provided to cover opposite surfaces of the non-magnetic metal layer and the dielectric layer from the magnetization free layer.

5 Claims, 22 Drawing Sheets

MAGNETORESISTIVE EFFECT ELEMENT AND MAGNETIC MEMORY

CROSS-REFERENCE TO RELATED APPLICATION

This application is a division of and claims the benefit of priority under 35 U.S.C. §120 from U.S. Ser. No. 11/368,383 filed Mar. 7, 2006, and claims the benefit of priority under 35 U.S.C. §119 from Japanese Patent Application No. 2005-197877 filed Jul. 6, 2005, the entire contents of each of which are incorporated herein by reference.

BACKGROUND OF THE INVENTION

1. Field of the Invention

The present invention relates to a magnetoresistive effect element and a magnetic memory.

2. Related Art

Magnetoresistive effect elements using magnetic material films are used in, for example, magnetic heads and magnetic sensors. In addition, it is proposed to use the magnetoresistive effect elements in solid state MRAMs (Magnetic Random Access Memories).

As a magnetoresistive effect transistor element which has a sandwich structure film formed by inserting a single layer of a dielectric between two ferromagnetic layers, which lets a current flow perpendicularly to the film surface, and utilizes a tunnel current, the so-called "ferromagnetic TMR (Tunneling Magneto-Resistance effect) element" is proposed. Since it has become possible to obtain a magnetoresistance change rate of 20% or more in the ferromagnetic tunneling magnetoresistance effect element, technical development for commercial application of the element to the MRAM is being conducted vigorously.

This TMR element can be implemented by forming a thin Al (aluminum) layer having a thickness in the range of 0.6 nm to 2.0 nm on a ferromagnetic layer, exposing a surface of the Al layer to oxygen glow discharge or oxygen gas, and thereby forming a tunnel barrier layer.

A ferromagnetic single tunnel junction having a structure obtained by providing one of the ferromagnetic layers having the tunnel barrier layer of a ferromagnetic single tunnel junction between with an antiferromagnetic layer is proposed. Furthermore, a ferromagnetic tunnel junction having magnetic particles scattered in a dielectric, and a ferromagnetic double tunnel junction having a continuous film as each of the ferromagnetic layers.

These magnetoresistive effect elements also have a possibility of being applied to the MRAMs because it has become possible to obtain a magnetoresistance change rate in the range of 20% to 50% and the decrease of the magnetoresistance change rate can also be suppressed by raising the voltage value applied to the TMR element to obtain a desired output voltage value. If a TMR element is used as a memory element of an MRAM, one of ferromagnetic layers having a tunnel barrier layer between is used as a magnetization pinned layer and the other of the ferromagnetic layers is used as a magnetic recording layer. The memory element using the ferromagnetic single tunnel junction or the ferromagnetic double tunnel junction is non-volatile, and has a potential that a write and read time is 10 nanoseconds or less and the number of times of rewriting is also $10^{15}$ or more. Especially in the memory element using the ferromagnetic double tunnel junction, the decrease of the magnetoresistance change rate can be suppressed even if the voltage value applied to the TMR element is raised, as described above. Therefore, a large output voltage is obtained, and characteristics that are favorable for the memory element are obtained.

As regards the cell size of the memory, there is a problem that the size cannot be made smaller than a semiconductor DRAM (Dynamic Random Access Memory) or less in the case where an architecture in which a memory cell is formed of one transistor and one TMR element.

In order to solve this problem, a diode type architecture including a series connection composed of a TMR element and a diode between a bit line and a word line and a simple matrix type architecture obtained by arranging cells each having a TMR element between a bit line and a word line are proposed.

In either case, inversion is conducted using a current magnetic field based on a current pulse when writing to the magnetic recording layer is executed, resulting in high power consumption. When the capacity is increased, there is a limit in allowable current density for wiring and consequently a large capacity cannot be obtained. Unless the absolute value of the current is 1 mA or less, or it is 0.2 mA or less for substitution for DRAMs, the area of the driver increases. As compared with other non-volatile solid-state memories, such as ferroelectric random access memories using ferroelectric capacitors or flash memories, there is a problem that the chip becomes large and competitive power is lost.

In order to solve the above-described problem, a solid-state magnetic memory having a thin film formed of a high permeability magnetic material around writing wiring is proposed. According to these magnetic memories, a high permeability magnetic film is provided around wiring, and consequently a current value required to write information into the magnetic recording layer can be reduced efficiently.

Even if they are used, however, it is very difficult to cause the write current value to become 1 mA or less.

In order to solve these problems, a write method using a spin injection method is proposed (see, for example, U.S. Pat. No. 6,256,223). This spin injection method utilizes inversion of magnetization of the magnetic recording layer obtained by injecting a spin-polarized current into the magnetic recording layer of the memory element.

In the case where the spin injection method is applied to the TMR element, there is a problem of element destruction such as breakdown of a tunnel insulation film and there is a problem in element reliability.

Even if writing is conducted using the spin injection method, therefore, it is necessary to provide a new magnetoresistive effect element, and material, structure and architecture of a magnetic memory capable of decreasing the current density at the time of writing to the extent that element destruction is not caused.

As described heretofore, a new highly reliable magnetoresistive effect element, and material, structure and architecture of a magnetic memory which make possible operation with low power consumption and low current writing and without element destruction are needed.

SUMMARY OF THE INVENTION

The present invention has been achieved on the basis of recognition of such problems. An object of the present invention is to provide a highly reliable magnetoresistive effect element that operates with low power consumption and low current writing, and a magnetic memory using such a magnetoresistive effect element.

A magnetoresistive effect element according to a first aspect of the present invention includes: a first magnetization pinned layer which includes at least one magnetic layer and in which a magnetization direction is pinned; a magnetization free layer in which a magnetization direction is changeable; a tunnel barrier layer provided between the first magnetization pinned layer and the magnetization free layer; a non-magnetic metal layer provided on a first region in an opposite surface of the magnetization free layer from the tunnel barrier layer; a dielectric layer provided on a second region other than the first region in the opposite surface of the magnetization free layer from the tunnel barrier layer; and a second magnetization pinned layer which includes at least one magnetic layer and in which a magnetization direction is pinned, the second magnetization pinned layer being provided so as to cover opposite surfaces respectively of the non-magnetic metal layer and the dielectric layer from the magnetization free layer.

An interface between the dielectric layer and the second magnetization pinned layer and an interface between the non-magnetic metal layer and the second magnetization pinned layer can be substantially coplanar.

An interface between the dielectric layer and the second magnetization pinned layer can be located farther from an interface between the tunnel barrier layer and the magnetization free layer than an interface between the non-magnetic metal layer and the second magnetization pinned layer.

The second magnetization pinned layer can have a three-layer structure in which a first magnetic layer, a first non-magnetic layer, and a second magnetic layer are stacked in order from a side of the non-magnetic metal layer, or a five-layer structure in which a first magnetic layer, a first non-magnetic layer, a second magnetic layer, a second non-magnetic layer, and a third magnetic layer are stacked in order from the side of the non-magnetic metal layer, and an interface between the dielectric layer and the second magnetization pinned layer can exist in the first magnetic layer.

A magnetoresistive effect element according to a second aspect of the present invention includes: a first magnetization pinned layer which comprises at least one magnetic layer and in which a magnetization direction is pinned; a magnetization free layer in which a magnetization direction is changeable; a tunnel barrier layer provided between the first magnetization pinned layer and the magnetization free layer; a non-magnetic metal layer provided on a first region in an opposite surface of the magnetization free layer from the tunnel barrier layer; a dielectric layer provided on a second region other than the first region in the opposite surface of the magnetization free layer from the tunnel barrier layer; and a second magnetization pinned layer which comprises at least one magnetic layer and in which a magnetization direction is pinned, the second magnetization pinned layer being provided on an opposite surface of the non-magnetic metal layer from the magnetization free layer.

An interface between the dielectric layer and the magnetization free layer and an interface between the non-magnetic metal layer and the magnetization free layer can be substantially coplanar.

An interface between the dielectric layer and the magnetization free layer can be located nearer an interface between the tunnel barrier layer and the magnetization free layer than an interface between the non-magnetic metal layer and the magnetization free layer.

A magnetoresistive effect element according to a third aspect of the present invention includes: a first magnetization pinned layer which includes at least one magnetic layer and in which a magnetization direction is pinned; a magnetization free layer in which a magnetization direction is changeable; a tunnel barrier layer provided between the first magnetization pinned layer and the magnetization free layer; a non-magnetic metal layer provided on an opposite surface of the magnetization free layer from the tunnel barrier layer; a dielectric layer provided on a first region in an opposite surface of the non-magnetic metal layer from the magnetization free layer; and a second magnetization pinned layer which includes at least one magnetic layer and in which a magnetization direction is pinned, the second magnetization pinned layer being provided so as to cover a second region other than the first region in the opposite surface of the non-magnetic metal layer from the magnetization free layer and an opposite surface of the dielectric layer from the non-magnetic metal layer.

An interface between the dielectric layer and the second magnetization pinned layer and an interface between the non-magnetic metal layer and the second magnetization pinned layer can be substantially coplanar.

An interface between the dielectric layer and the second magnetization pinned layer can be located farther from an interface between the tunnel barrier layer and the magnetization free layer than an interface between the non-magnetic metal layer and the second magnetization pinned layer.

The second magnetization pinned layer can have a three-layer structure in which a first magnetic layer, a first non-magnetic layer, and a second magnetic layer are stacked in order from a side of the non-magnetic metal layer, or a five-layer structure in which a first magnetic layer, a first non-magnetic layer, a second magnetic layer, a second non-magnetic layer, and a third magnetic layer are stacked in order from the side of the non-magnetic metal layer, and an interface between the dielectric layer and the second magnetization pinned layer exists in the first magnetic layer.

A magnetoresistive effect element according to a fourth aspect of the present invention includes: a first magnetization pinned layer which includes at least one magnetic layer and in which a magnetization direction is pinned; a magnetization free layer in which a magnetization direction is changeable; a tunnel barrier layer provided between the first magnetization pinned layer and the magnetization free layer; a non-magnetic metal layer provided on an opposite surface of the magnetization free layer from the tunnel barrier layer; a dielectric layer provided on a first region in an opposite surface of the non-magnetic metal layer from the magnetization free layer; and a second magnetization pinned layer which includes at least one magnetic layer and in which a magnetization direction is pinned, the second magnetization pinned layer being provided on a second region other than the first region in the opposite surface of the non-magnetic metal layer from the magnetization free layer.

An interface between the non-magnetic metal layer and the dielectric layer can be located nearer an interface between the tunnel barrier layer and the magnetization free layer than an interface between the non-magnetic metal layer and the second magnetization pinned layer.

A magnetoresistive effect element according to a fifth aspect of the present invention includes: a first magnetization pinned layer which includes at least one magnetic layer and in which a magnetization direction is pinned; a magnetization free layer in which a magnetization direction is changeable; a tunnel barrier layer provided between the first magnetization pinned layer and the magnetization free layer; a dielectric layer provided on a first region in an opposite surface of the magnetization free layer from the tunnel barrier layer; a non-magnetic metal layer provided on a second region other than the first region in the opposite surface of the magnetization free layer from the tunnel barrier layer so as to cover an opposite surface of the dielectric layer from the magnetization free layer; and a second magnetization pinned layer which includes at least one magnetic layer and in which a magnetization direction is pinned, the second magnetization pinned layer being provided on an opposite surface of the non-magnetic metal layer from the magnetization free layer.

An interface between the dielectric layer and the magnetization free layer and an interface between the non-magnetic metal layer and the magnetization free layer can be substantially coplanar.

An interface between the dielectric layer and the magnetization free layer can be located nearer an interface between the tunnel barrier layer and the magnetization free layer than an interface between the non-magnetic metal layer and the magnetization free layer.

An interface between the non-magnetic metal layer and the dielectric layer can be located farther from an interface between the tunnel barrier layer and the magnetization free layer than an interface between the non-magnetic metal layer and the magnetization free layer.

A magnetoresistive effect element according to a sixth aspect of the present invention includes: a first magnetization pinned layer which includes at least one magnetic layer and in which a magnetization direction is pinned; a magnetization free layer in which a magnetization direction is changeable; a tunnel barrier layer provided between the first magnetization pinned layer and the magnetization free layer; a non-magnetic metal layer provided on an opposite surface of the magnetization free layer from the tunnel barrier layer; a second magnetization pinned layer which includes at least one magnetic layer and in which a magnetization direction is pinned, the second magnetization pinned layer being provided on an opposite surface of the non-magnetic metal layer from the magnetization free layer; and a dielectric layer which passes through the magnetization free layer and at least a part of the non-magnetic metal layer and which does not pass through the second magnetization pinned layer.

A magnetization direction of a magnetic layer included in the first magnetization pinned layer and located nearest the magnetization free layer can be substantially parallel to a magnetization direction of a magnetic layer included in the second magnetization pinned layer and located nearest the magnetization free layer, and the non-magnetic metal layer can include Ru, Ir, Os or an alloy of them.

A magnetization direction of a magnetic layer included in the first magnetization pinned layer and located nearest the magnetization free layer can be substantially antiparallel to a magnetization direction of a magnetic layer included in the second magnetization pinned layer and located nearest the magnetization free layer, and the non-magnetic metal layer can include Cu, Ag, Au, Rh, Ir, or an alloy of them.

The dielectric layer and the tunnel barrier layer can include $Al_2O_3$, $SiO_2$, MgO, AlN, SiON, or AlON.

At least one of the first and second magnetization pinned layers can have a three-layer structure comprising a magnetic layer/a non-magnetic layer/a magnetic layer, or a five-layer structure comprising a magnetic layer/a non-magnetic layer/a magnetic layer/a non-magnetic layer/a magnetic layer.

A magnetic memory according to a seventh aspect of the present invention includes: a memory cell including a magnetoresistive effect element above-described; a first wiring electrically connected to one end of the magnetoresistive effect element; and a second wiring electrically connected to the other end of the magnetoresistive effect element.

DETAILED DESCRIPTION OF THE INVENTION

Hereafter, embodiments of the present invention will be described in detail with reference to the drawings.

First Embodiment

Figure 1:
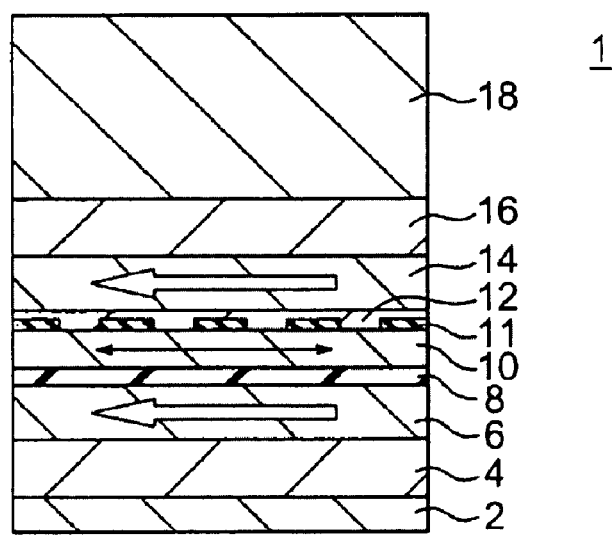
FIG. 1 is a sectional view showing a magnetoresistive effort element according to a first embodiment of the present invention.

A magnetoresistive effect element according to a first embodiment of the present invention is shown in FIG. 1. The magnetoresistive effect element 1 according to this embodiment includes an antiferromagnetic layer 4 provided on an underlying layer 2, a first magnetization pinned layer 6 including a magnetic layer provided on the antiferromagnetic layer 4, in which the direction of magnetization (spin) is pinned by exchange coupling force to the antiferromagnetic layer 4, a tunnel barrier layer 8 provided on the first magnetization pinned layer 6, a magnetization free layer (magnetic recording layer) 10 having a changeable magnetization direction provided on the tunnel barrier layer 8, a second magnetization pinned layer 14 provided on the magnetic recording layer 10 so as to include a non-magnetic metal layer 12, which is divided by a dielectric 11 at least on its interface side in contact with the magnetic recording layer 10, and a magnetic layer provided on the non-magnetic metal layer and having the magnetization of which direction is pinned, an antiferromagnetic layer 16 provided on the second magnetization pinned layer 14 to pin the direction of magnetization in the second magnetization pinned layer 14 by using exchange coupling force, and a metal hard mask or metal protection film 18 provided on the antiferromagnetic layer 16.

Figure 31:
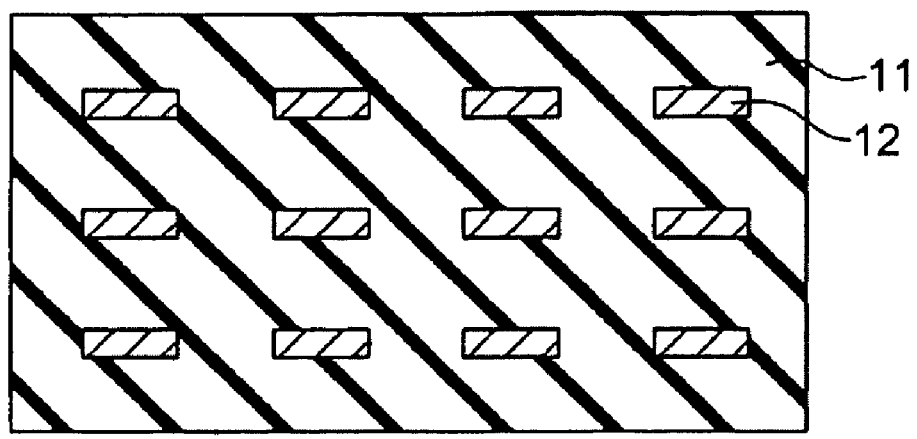
FIG. 31 is a horizontal sectional view showing an example of an arrangement relation between a non-magnetic metal layer and a dielectric.

A horizontal sectional view taken near an interface between the non-magnetic metal layer 12 and the magnetic recording layer 10 (a sectional view at a plane parallel to the interface) is shown in FIG. 31. As appreciated from FIG. 31, the non-magnetic metal layer 12 is divided by the dielectric 11 on its magnetic recording layer 10 side. However, the non-magnetic metal layer 12 is not divided by the dielectric 11 on its second magnetization pinned layer 14 side. In other words, a part of the non-magnetic metal layer is divided by the dielectric 11. Since at least a part of the non-magnetic metal layer is thus divided by the dielectric 11, a current flowing through the non-magnetic metal layer 12 flows through a place which is not divided by the dielectric 11, in a concentrative manner. Therefore, the non-magnetic metal layer 12 is referred to as current concentration type non-magnetic layer as well. By the way, as appreciated from FIG. 1, an interface between the dielectric 11 and the magnetization free layer 10 and an interface between the non-magnetic metal player 12 and the magnetization free layer 10 are substantially coplanar. An opposite surface of the dielectric 11 from the magnetization free layer 10 does not reach a surface between the non-magnetic metal layer 12 and the second magnetization pinned layer 14.

Furthermore, in the present embodiment, the first magnetization pinned layer 6 and the second magnetization pinned layer 14 are substantially parallel to each other in magnetization direction. In addition, the non-magnetic metal layer 12 is formed of Ru, Ir, Os or an alloy of them. Here, "directions of magnetization are parallel" means that "directions of magnetization are the same." "Directions of magnetization are antiparallel" means that "directions of magnetization are opposite."

In a structure like the magnetoresistive effect element of the present embodiment, the magnetic recording layer 10 is subjected to two kinds of torque, i.e., spin torque caused by spin-polarized electrons that have tunneled the tunnel barrier layer 8, and torque caused by spin-polarized electrons reflected by the current concentration type non-magnetic layer 12.

If the non-magnetic layer 12 is not divided by the dielectric, but formed of a continuous film, then the resistance difference between the tunnel barrier layer and the non-magnetic metal layer 12 becomes too large and consequently the effect of spin reflection is reduced and the current density is not reduced so much.

On the other hand, the effect of the spin reflection is made more remarkable and the spin inversion current density is reduced by making the resistance of the tunnel barrier layer 8 nearly equal to the resistance of the current concentration type non-magnetic layer 12. It is desirable to make the film thickness of the dielectric 11 which divides a part of the current concentration type non-magnetic layer 12 equal to at least the film thickness of the tunnel barrier layer 8 in order to make the resistance of the tunnel barrier layer 8 nearly equal to the resistance of the current concentration type non-magnetic layer 12.

In general, the spin injection writing principle of an ordinary GMR element obtained by laminating a magnetization pinned layer/a non-magnetic layer/a magnetic recording layer, and an ordinary tunnel junction element obtained by laminating a magnetization pinned layer/a tunnel barrier layer/a magnetic recording layer will be described hereafter.

a) In the case where the spin moment of the magnetization pinned layer and the magnetic recording layer is spin-inverted from antiparallel to parallel:

Electrons are injected from the magnetization pinned layer side, and electrons spin-polarized in the magnetization pinned layer tunnel the tunnel barrier layer (or the non-magnetic layer) and exert spin torque on the magnetic recording layer. As a result, the spin of the magnetic recording layer are inverted from antiparallel to parallel.

b) In the case where the spin moment of the magnetization pinned layer and the magnetic recording layer is spin-inverted from parallel to antiparallel:

Electrons are injected from the magnetic recording layer, and electrons spin-polarized in the magnetization pinned layer tunnel the tunnel barrier layer. At that time, electrons having the same spin direction as that of the magnetization pinned layer have a high tunnel probability and tunnel easily. However, the antiparallel spin is reflected. Electrons reflected to the magnetic recording layer exert spin torque on the magnetic recording layer. Thus, the spin of the magnetic recording layer is inverted from parallel to antiparallel.

The current required at this time can be represented by the following expressions.

In the case of antiparallel to parallel:

$$IC^P = e\alpha MA_t[H - H_k - 2\pi M]/\hbar g(\pi)$$

In the case of parallel to antiparallel:

$$IC^{AP} = e\alpha MA_t[H + H_k + 2\pi M]/\hbar g(0)$$

Here, e is the elementary charge, $\alpha$ is the Gilbert damping parameter, M is magnetization, $A_t$ is the volume of the magnetic recording layer, H is the magnetic field, $H_k$ is the anisotropy constant, and h is the Plank's constant. Furthermore, $g(\pi)$ and $g(0)$ depend upon the spin at the interface between the magnetization pinned layer and the non-magnetic layer, and they are given by the following equation.

$$g(\theta) = [-4 + (1+p)^3(3 + \cos\theta)/4p^{3/2}]^{-1}$$

Here, p is a spin polarization factor. From this equation, it follows that $g(\pi) > g(0)$. In general, therefore, the current $IC^P$ in the case where the spin is inverted from antiparallel to parallel is smaller than the current $IC^{AP}$ in the case where the spin is inverted from parallel to antiparallel.

For example, when letting flow a spin injection current from the metal protection film 18 toward the underlying layer 2 in the magnetoresistive effect element 1 shown in FIG. 1, electrons are injected from the first magnetization pinned layer 6 into the magnetic recording layer 10, and electrons spin-polarized in the same direction as the magnetic moment of the first magnetization pinned layer by the first magnetization pinned layer pass through the tunnel barrier layer 8 and provide the magnetic recording layer 10 with spin torque. In addition, electrons are injected into the second magnetization pinned layer 14 via the magnetic recording layer 10 and the non-magnetic metal layer 12. By selecting the above-described material (any one of Ru, Ir, Os, or an alloy of them) as the material of the non-magnetic metal layer 12, electrons having the spin that is the same in direction as the magnetic moment of the second magnetization pinned layer 14 are reflected by the second magnetization pinned layer 14, and injected into the magnetic recording layer 10 again as reflected spin electrons. As a result, the magnetization direction of the magnetic recording layer 10 becomes the same as (parallel to) that of the first magnetization pinned layer 6.

When letting flow a spin injection current from the underlying layer 2 toward the metal protection film 18, electrons are injected from the second magnetization pinned layer 14 into the magnetic recording layer 10 via the non-magnetic metal layer 12. By selecting the above-described material as the material of the non-magnetic metal layer 12, electrons having a spin opposite to the magnetic moment of the second magnetization pinned layer 14 become dominant when electrons spin-polarized in the second magnetization pinned layer 14 pass through the non-magnetic metal layer 12. The spin-polarized electrons provide the magnetic recording layer 10 with spin torque. In addition, the spin-polarized electrons attempt to flow from the magnetic recording layer 10 to the first magnetization pinned layer 6 via the tunnel barrier layer 8. When passing through the tunnel barrier layer 8, however, electrons having a spin opposite to the magnetic moment of the first magnetization pinned layer 6 are reflected because the tunnel probability becomes low. The electrons having the spin opposite to the magnetic moment of the first magnetization pinned layer 6 provide the magnetic recording layer 10 with spin torque again as reflected spin electrons. As a result, the magnetization direction of the magnetic recording layer 10 becomes opposite to (antiparallel to) that of the first magnetization pinned layer 6.

In the present embodiment having the current concentration type non-magnetic layer 12 shown in FIG. 1, the resistance of the non-magnetic metal layer 12 is regulated. As a result, the reflected spin electrons also exert spin torque on the magnetic recording layer as described above. The current density is reduced, and the current in the case where spin inversion from parallel to antiparallel is conducted and the current in the case where spin inversion from antiparallel to parallel is conducted become nearly equal low values. Therefore, it is possible to obtain a highly reliable magnetoresistive effect element that operates with low power consumption and low current writing and without element destruction.

Figure 2:
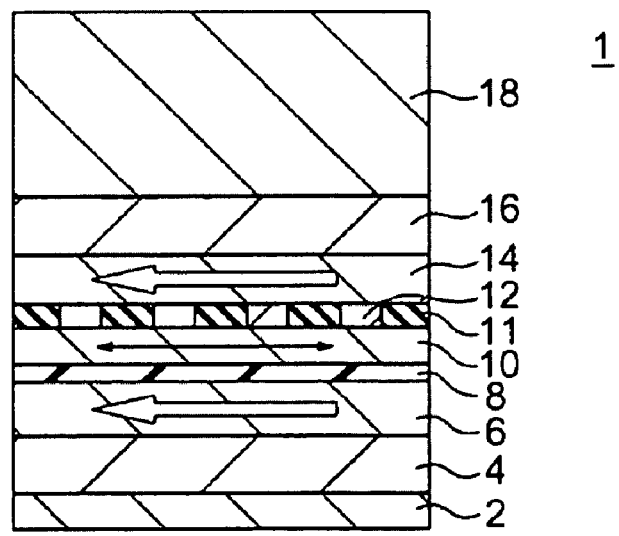
FIG. 2 is a sectional view showing a magnetoresistive effort element according to a first modification of the first embodiment.

In order to regulate the resistance of the non-magnetic metal layer 12, the non-magnetic metal layer 12 may be divided by the dielectric 11 not only at the interface in contact with the magnetic recording layer 10 but also on the second magnetization pinned layer 14 side as shown in FIG. 2. In other words, the non-magnetic metal layer 12 may be divided by the dielectric 11 completely (first modification). The first modification has a configuration obtained by causing the interface between the dielectric 11 and the second magnetization pinned layer 14 provided on the opposite side from the magnetic recording layer 10 and the interface between the non-magnetic metal layer 12 and the second magnetization pinned layer 14 to be coplanar. In the first modification as well, effects similar to those in the present embodiment can be obtained.

Figure 3:
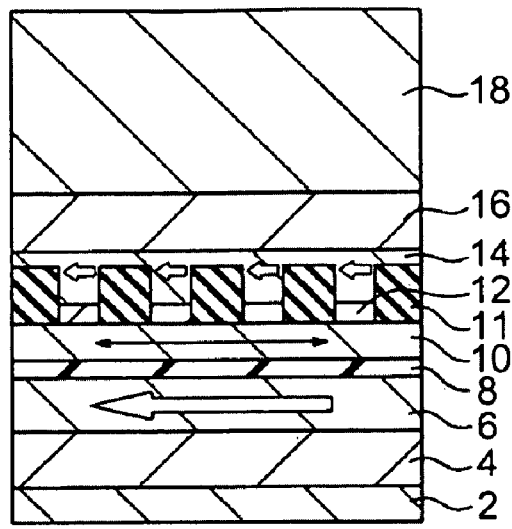
FIG. 3 is a sectional view showing a magnetoresistive effort element according to a second modification of the first embodiment.

Furthermore, in order to regulate the resistance, the dielectric 11 that completely divide the non-magnetic metal layer 12 may divide a part of the second magnetization pinned layer 14 as shown in FIG. 3 as shown in FIG. 3 (second modification). In other words, the interface between the dielectric 11 and the second magnetization pinned layer 14 is located farther from the interface between the tunnel barrier layer 8 and the magnetization free layer 10 than the interface between the non-magnetic metal layer 12 and the second magnetization pinned layer 14 as appreciated from FIG. 3. In the second modification as well, effects similar to those in the present embodiment can be obtained.

Figure 4:
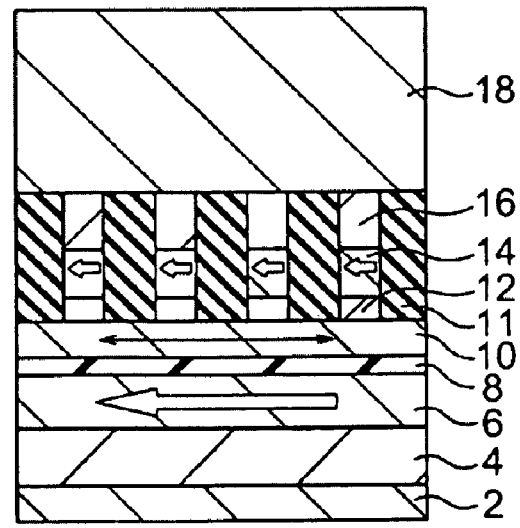
FIG. 4 is a sectional view showing a magnetoresistive effort element according to a third modification of the first embodiment.

In order to adjust the resistance, the dielectric 11 that completely divide the non-magnetic metal layer 12 may completely divide the second magnetization pinned layer 14 and the antiferromagnetic layer 16 as shown in FIG. 4 (third modification). In other words, the opposite surface of the dielectric 11 from the magnetization free layer 10 and the interface between the antiferromagnetic layer 16 and the metal protection film 18 are substantially coplanar as appreciated from FIG. 4. In the third modification as well, effects similar to those in the present embodiment can be obtained.

Figure 5:
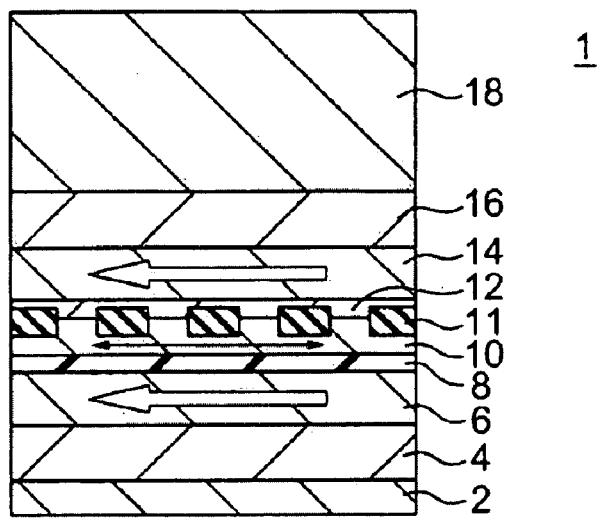
FIG. 5 is a sectional view showing a magnetoresistive effort element according to a fourth modification of the first embodiment.

Furthermore, in order to regulate the resistance, the dielectric 11 may divide a part of the magnetic recording layer 10 and a part of the non-magnetic metal layer 12 as shown in FIG. 5 (fourth modification). In other words, the opposite surface of the dielectric 11 from the magnetization free layer 10 is located nearer the second magnetization pinned layer 14 than the interface between the non-magnetic metal layer 12 and the magnetization free layer 10 as appreciated from FIG. 5. In addition, a surface of the dielectric 11 on the side of the magnetization free layer 10 is located nearer the tunnel barrier layer 8 than the interface between the non-magnetic metal layer 12 and the magnetization free layer 10. In the fourth modification as well, effects similar to those in the present embodiment can be obtained.

Figure 6:
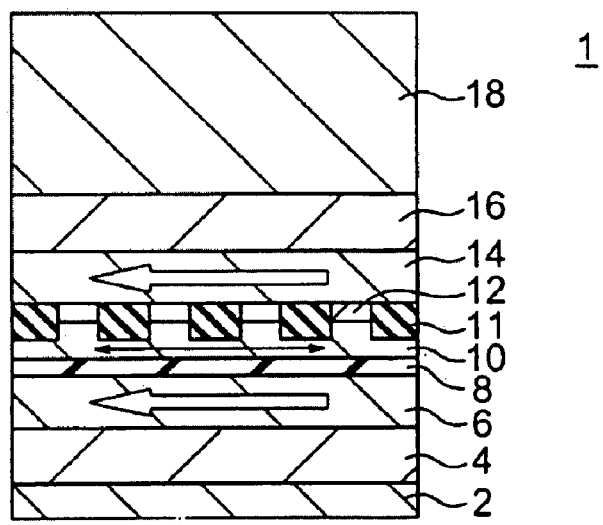
FIG. 6 is a sectional view showing a magnetoresistive effort element according to a fifth modification of the first embodiment.

In order to regulate the resistance, the dielectric 11 may divide a part of the magnetic recording layer 10 and completely the non-magnetic metal layer 12 as shown in FIG. 6 (fifth modification). In other words, the opposite surface of the dielectric 11 from the magnetization free layer 10 and the interface between the non-magnetic metal layer 12 and the second magnetization pinned layer 14 are substantially coplanar as appreciated from FIG. 6. In addition, the surface of the dielectric 11 on the side of magnetization free layer 10 is located nearer the tunnel barrier layer 8 than the interface between the non-magnetic metal layer 12 and the magnetization free layer 10. In the fifth modification as well, effects similar to those in the present embodiment can be obtained.

Figure 7:
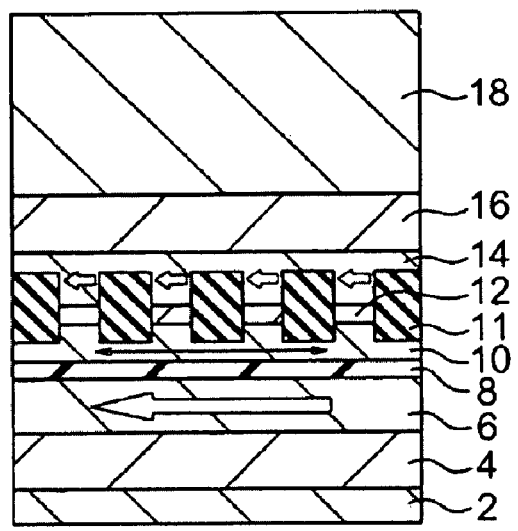
FIG. 7 is a sectional view showing a magnetoresistive effort element according to a sixth modification of the first embodiment.

Furthermore, in order to regulate the resistance, the dielectric 11 may divide a part of the magnetic recording layer 10, completely divide the non-magnetic metal layer 12, and divide a part of the second magnetization pinned layer 14 as shown in FIG. 7 (sixth modification). In other words, the opposite surface of the dielectric 11 from the magnetization free layer 10 is located farther from the interface between the tunnel barrier layer 8 and the magnetization free layer 10 than the interface between the non-magnetic metal layer 12 and the magnetization free layer 10 as appreciated from FIG. 7. In the sixth modification as well, effects similar to those in the present embodiment can be obtained.

Figure 8:
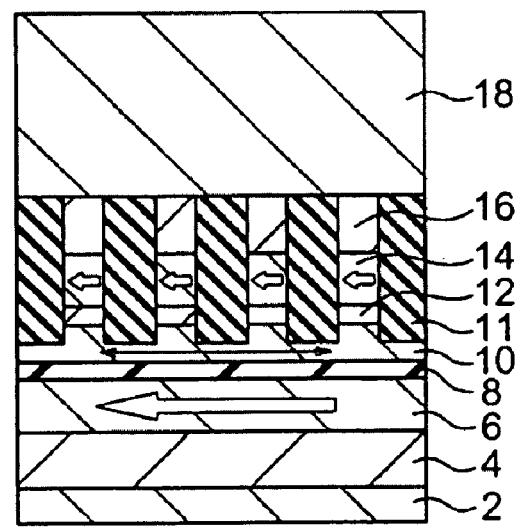
FIG. 8 is a sectional view showing a magnetoresistive effort element according to a seventh modification of the first embodiment.

In order to regulate the resistance, the dielectric 11 may divide a part of the magnetic recording layer 10 and completely divide the non-magnetic metal layer 12, the second magnetization pinned layer 14 and the antiferromagnetic layer 16 as shown in FIG. 8 (seventh modification). In other words, the opposite surface of the dielectric 11 from the magnetization free layer 10 and the interface between the antiferromagnetic layer 16 and the metal protection film 18 are substantially coplanar as appreciated from FIG. 8. In addition, the surface of the dielectric 11 on the side of the magnetization free layer 10 is located nearer the tunnel barrier layer 8 than the interface between the non-magnetic metal layer 12 and the magnetization free layer 10. In the seventh modification as well, effects similar to those in the present embodiment can be obtained.

Figure 33:
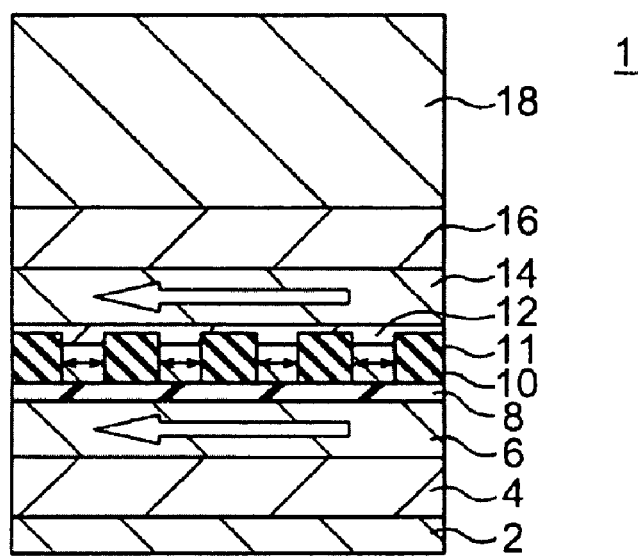
FIG. 33 is a sectional view showing a magnetoresistive effect element according to an eighth modification of the first embodiment.
Figure 34:
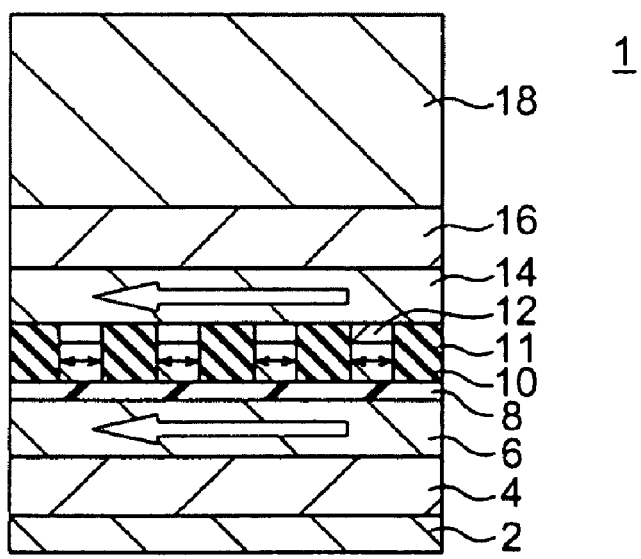
FIG. 34 is a sectional view showing a magnetoresistive effect element according to a ninth modification of the first embodiment.

In the fourth and fifth modifications respectively shown in FIG. 5 and FIG. 6, the dielectric 11 divides a part of the magnetic recording layer 10. In order to regulate the resistance, however, the dielectric 11 may completely divide the magnetic recording layer 10 as shown in FIG. 33 and FIG. 34 (eighth and ninth modifications). In the eighth and ninth modifications, effects similar to those in the present embodiment can be obtained. In the eighth modification shown in FIG. 33, the dielectric 11 passes through the magnetic recording layer 10 and a part of the non-magnetic metal layer 12. However, the dielectric 11 does not pass through the second magnetization pinned layer 14.

Figure 35:
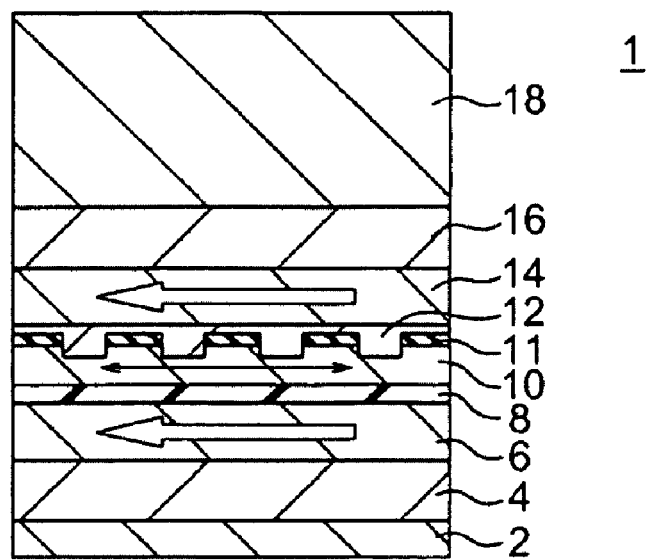
FIG. 35 is a sectional view showing a magnetoresistive effect element according to a tenth modification of the first embodiment.
Figure 36:
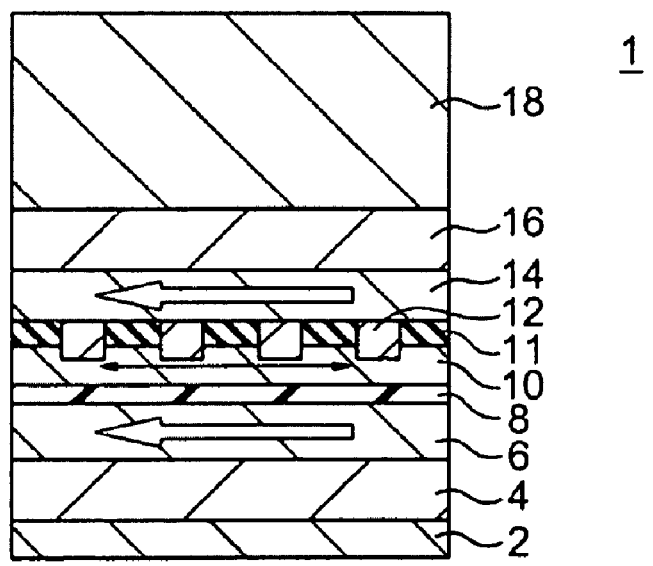
FIG. 36 is a sectional view showing a magnetoresistive effect element according to an eleventh modification of the first embodiment.

Furthermore, in the present embodiment shown in FIG. 1 and the first modification shown in FIG. 2, the interface between the non-magnetic metal layer 12 and the magnetic recording layer 10 and the interface between the dielectric 11 and the magnetic recording layer 10 are substantially coplanar. In order to regulate the resistance, however, the interface between the non-magnetic metal layer 12 and the magnetic recording layer 10 may be located nearer the interface between the magnetic recording layer 10 and the tunnel barrier layer 8 than the interface between the dielectric 11 and the magnetic recording layer 10 as shown in FIG. 35 and FIG. 36 (tenth and eleventh modifications). In the tenth and eleventh modifications as well, effects similar to those in the present embodiment can be obtained.

Second Embodiment

Figure 9:
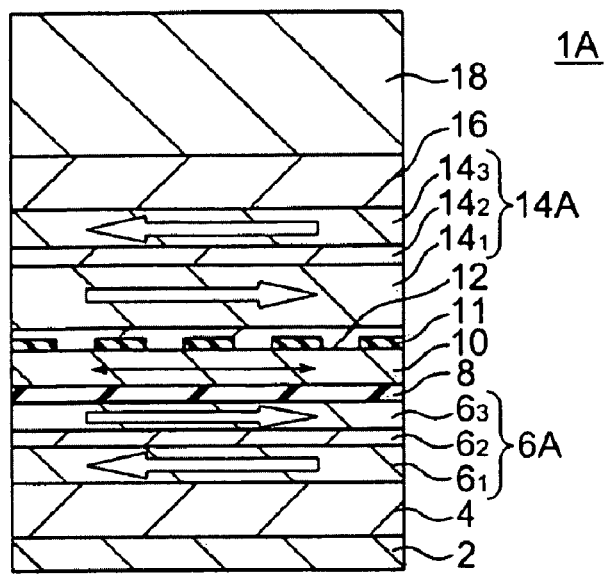
FIG. 9 is a sectional view showing a magnetoresistive effort element according to a second embodiment.

A magnetoresistive effect element 1A according to a second embodiment of the present invention is shown in FIG. 9. The magnetoresistive effect element 1A according to the present embodiment has a configuration obtained by replacing the first magnetization pinned layer 6 in the magnetoresistive effect element 1 according to the first embodiment shown in FIG. 1 with a synthetic first magnetization pinned layer 6A having a three-layer structure which includes a magnetic layer $6_1$, a non-magnetic layer $6_2$ and a magnetic layer $6_3$, and replacing the second magnetization pinned layer 14 with a synthetic second magnetization pinned layer 14A having a three-layer structure which includes a magnetic layer $14_1$, a non-magnetic layer $14_2$ and a magnetic layer $14_3$. The magnetic layer $6_1$ is pinned in magnetization direction by the antiferromagnetic layer 4. The magnetic layer $6_3$ is coupled to the magnetic layer $6_1$ antiferromagntically via the non-magnetic layer $6_2$. The magnetic layer $14_3$ is pinned in magnetization direction by the antiferromagnetic layer 16. The magnetic layer $14_1$ is coupled to the magnetic layer $14_3$ antiferromagntically via the non-magnetic layer $14_2$.

In the present embodiment, the magnetic layer $6_3$ included in the first magnetization pinned layer 6A and located nearest the magnetic recording layer 10 is substantially parallel in magnetization direction to the magnetic layer $14_1$ included in the second magnetization pinned layer 14A and located nearest the magnetic recording layer 10.

It is desirable to use such a synthetic magnetization pinned layer, because the magnetization pinning becomes firmer and the first and second magnetization pinned layers become more stable when spin injection writing is conducted.

By the way, the synthetic magnetization pinned layer may be one of the first and second magnetization pinned layers.

In the present embodiment as well, it is possible to obtain a highly reliable magnetoresistive effect element that operates with low power consumption and low current writing and without element destruction, in the same way as the first embodiment.

Figure 10:
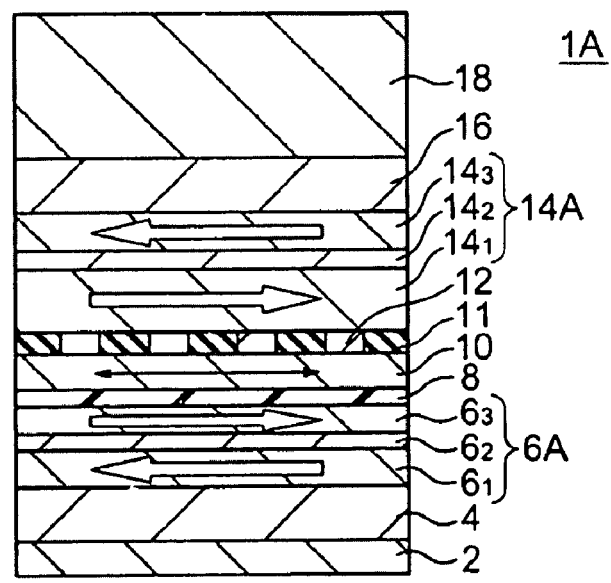
FIG. 10 is a sectional view showing a magnetoresistive effort element according to a first modification of the second embodiment.

In order to regulate the resistance of the non-magnetic metal layer 12, the non-magnetic metal layer 12 may be divided by the dielectric 11 not only at the interface in contact with the magnetic recording layer 10 but also on the second magnetization pinned layer 14 side as shown in FIG. 10. In other words, the non-magnetic metal layer 12 may be divided by the dielectric 11 completely (first modification). In the first modification as well, effects similar to those in the present embodiment can be obtained.

Figure 11:
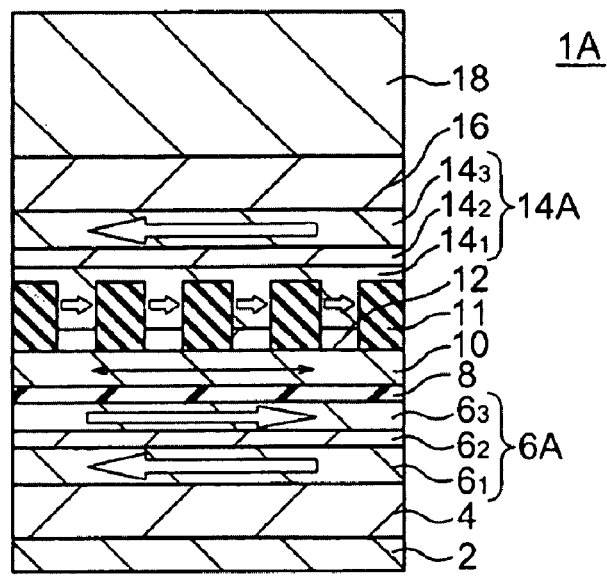
FIG. 11 is a sectional view showing a magnetoresistive effort element according to a second modification of the second embodiment.

Furthermore, in order to regulate the resistance, the dielectric 11 that completely divides the non-magnetic metal layer 12 may divide a part of the magnetic layer 14, in the second magnetization pinned layer 14A as shown in FIG. 11 (second modification). In the second modification as well, effects similar to those in the present embodiment can be obtained.

Figure 12:
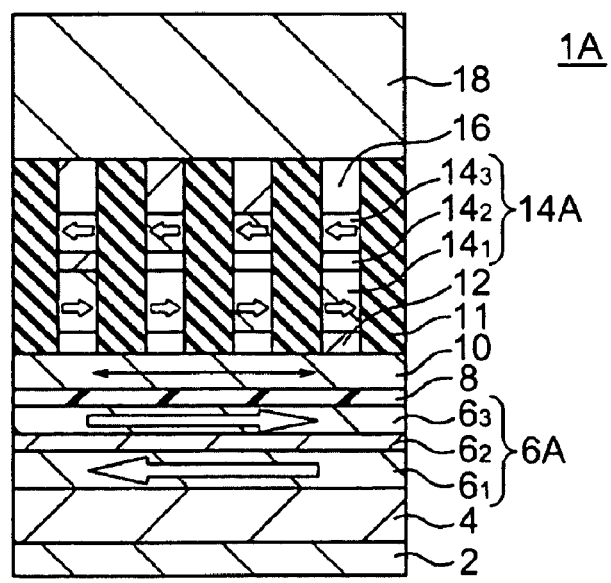
FIG. 12 is a sectional view showing a magnetoresistive effort element according to a third modification of the second embodiment.

In order to regulate the resistance, the dielectric 11 that completely divides the non-magnetic metal layer 12 may completely divide the second magnetization pinned layer 14 and the antiferromagnetic layer 16 as shown in FIG. 12 (third modification). In the third modification as well, effects similar to those in the present embodiment can be obtained.

In the present embodiment and its first to third modifications as well, the dielectric 11 may divide a part of the magnetic recording layer 10 in the same way as the fourth to seventh modifications of the first embodiment respectively shown in FIGS. 5 to 8. The dielectric 11 may completely divide the magnetic recording layer 10 in the same way as the eighth and ninth modifications of the first embodiment. The interface between the non-magnetic metal layer 12 and the magnetic recording layer 10 may be located nearer the interface between the magnetic recording layer 10 and the tunnel barrier layer 8 than the interface between the dielectric 11 and the magnetic recording layer 10 in the same way as the tenth and eleventh modifications of the first embodiment. In these cases as well, effects similar to those in the present embodiment can be obtained.

Third Embodiment

Figure 13:
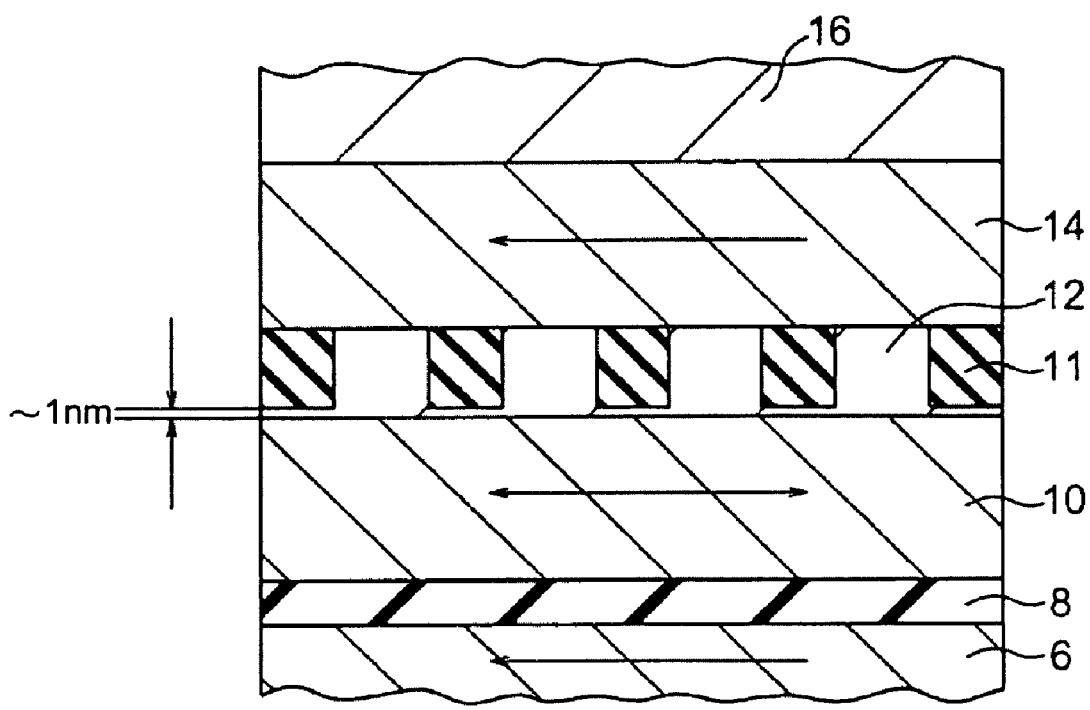
FIG. 13 is a sectional view showing a magnetoresistive effort element according to a third embodiment.

A magnetoresistive effect element according to a third embodiment of the present invention will now be described with reference to FIG. 13. The magnetoresistive effect element according to the present embodiment has a configuration in which the non-magnetic metal layer 12 is not divided by the dielectric 11 on the magnetic recording layer 10 side, but divided by the dielectric 11 on the second magnetization pinned layer 14 side in the magnetoresistive effect element according to the first embodiment shown in FIG. 1 (see FIG. 13).

In the present embodiment as well, at least a part of the non-magnetic metal layer 12 is divided by the dielectric 11 and consequently the current flowing through the non-magnetic metal layer 12 flows through a place that is not divided by the dielectric 11 in a concentrative manner in the same way as the first embodiment.

In the present embodiment as well, therefore, it becomes possible to adjust the resistance and it is possible to obtain a highly reliable magnetoresistive effect element that operates with low power consumption and low current writing and without element destruction in the same way as the first embodiment.

By the way, it is desirable that the distance between the bottom surface of the dielectric 11 and the magnetic recording layer 10 is approximately 1 nm.

The structure having a distance between the bottom surface of the dielectric 11 and the magnetic recording layer 10 as in the present embodiment may be used in the magnetoresistive effect elements according to the first embodiment, the second and third modifications of the first embodiment, the second embodiment, and the second and third modifications of the second embodiment as well.

Fourth Embodiment

Figure 14:
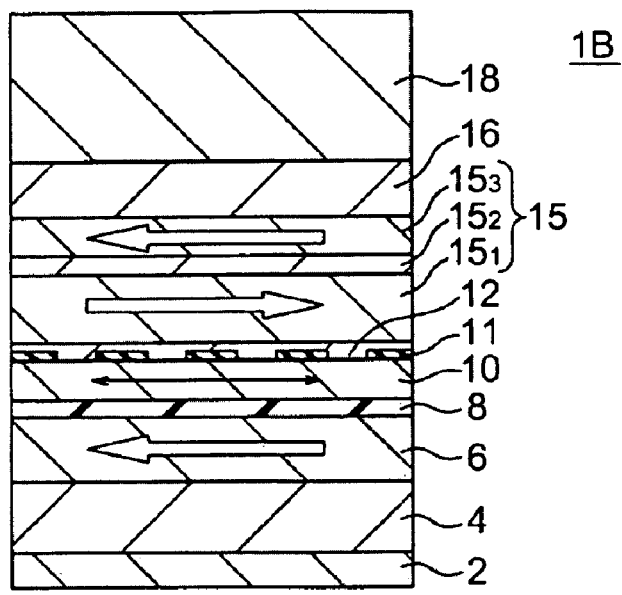
FIG. 14 is a sectional view showing a magnetoresistive effort element according to a fourth embodiment.

A magnetoresistive effect element according to a fourth embodiment of the present invention is shown in FIG. 14. A magnetoresistive effect element 1B according to the present embodiment has a configuration obtained by replacing the second magnetization pinned layer 14 in the magnetoresistive effect element 1A according to the first embodiment shown in FIG. 1 with a second magnetization pinned layer 15 having a synthetic structure. The second magnetization pinned layer 15 having the synthetic structure includes a magnetic layer $15_1$ provided on the non-magnetic metal layer (current concentration type non-magnetic layer) 12, a non-magnetic layer $15_2$ provided on the magnetic layer $15_1$, and a magnetic layer $15_3$ pinned in magnetization by exchange coupling to the antiferromagnetic layer 16. The magnetic layer $15_1$ is coupled ferromagnetically to the magnetic layer $15_3$ via the non-magnetic layer $15_2$. In the present embodiment, the direction of magnetization of the first magnetization pinned layer 6 is substantially antiparallel to the direction of magnetization of the magnetic layer $15_1$ included in the second magnetization pinned layer 15 and located nearest the magnetic recording layer 10. In addition, the non-magnetic metal layer 12 is formed any one of Cu, Ag, Au, Rh, Ir, or an alloy of them.

If a spin injection current is let flow from the metal protection film 18 toward the underlying layer 2 in the structure according to the present embodiment, then spin-polarized electrons are injected from the first magnetization pinned layer 6 to the magnetic recording layer 10 and the magnetic recording layer 10 is provided with spin torque. In addition, electrons are injected into the second magnetization pinned layer 15 via the magnetic recording layer 10 and the non-magnetic metal layer 12. By selecting the above-described material (any one of Cu, Ag, Au, Rh, Ir, or an alloy of them) as the material of the non-magnetic metal layer 12, electrons having a spin opposite to the magnetic moment of the second magnetization pinned layer 15 are reflected by the second magnetization pinned layer 15, and injected into the magnetic recording layer 10 as reflected spin electrons again. As a result, the magnetization direction of the magnetic recording layer 10 becomes the same as (parallel to) that of the first magnetization pinned layer 6.

If a spin injection current is let flow from the underlying layer 2 to the metal protection film 18, then spin-polarized electrons are injected from the second magnetization pinned layer 15 to the magnetic recording layer 10 and the magnetic recording layer 10 is provided with spin torque. In addition, the spin-polarized electrons attempt to flow from the magnetic recording layer 10 to the first magnetization pinned layer 6 via the tunnel barrier layer 8. When passing through the tunnel barrier layer 8, however, electrons having a spin opposite to the magnetic moment of the first magnetization pinned layer 6 are reflected because the tunnel probability becomes low. The electrons having the spin opposite to the magnetic moment of the first magnetization pinned layer 6 provide the magnetic recording layer 10 with spin torque again as reflected spin electrons. As a result, the magnetization direction of the magnetic recording layer 10 becomes the same as that of the second magnetization pinned layer 15 (antiparallel to the magnetization direction of the first magnetization pinned layer 6).

Especially, in the same way as the first embodiment, the resistance of the non-magnetic metal layer 12 is regulated. As a result, the reflected spin electrons also exert spin torque on the magnetic recording layer and the current density is reduced. In addition, the current in the case where spin inversion from parallel to antiparallel is conducted and the current in the case where spin inversion from antiparallel to parallel is conducted become nearly equal low values. Therefore, it is possible to obtain a highly reliable magnetoresistive effect element that operates with low power consumption and low current writing and without element destruction.

Figure 15:
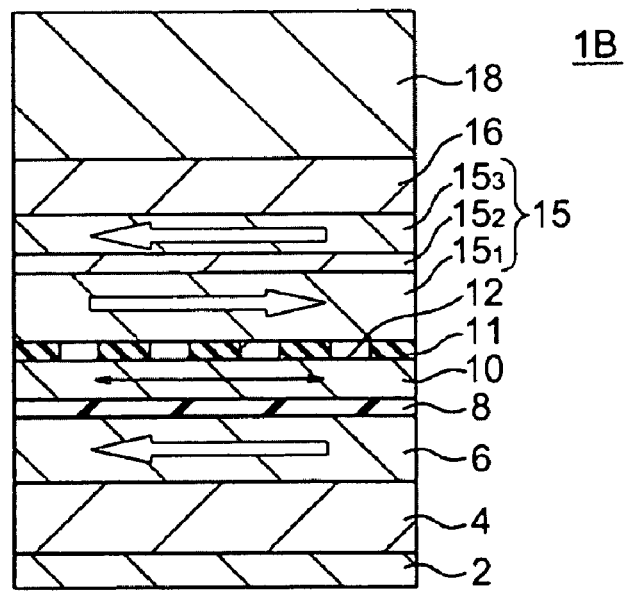
FIG. 15 is a sectional view showing a magnetoresistive effort element according to a first modification of the fourth embodiment.

In order to regulate the resistance of the non-magnetic metal layer 12, the non-magnetic metal layer 12 may be divided by the dielectric 11 not only at the interface in contact with the magnetic recording layer 10 but also on the second magnetization pinned layer 15 side as shown in FIG. 15. In other words, the non-magnetic metal layer 12 may be divided by the dielectric 11 completely (first modification). In the first modification as well, effects similar to those in the present embodiment can be obtained.

Figure 16:
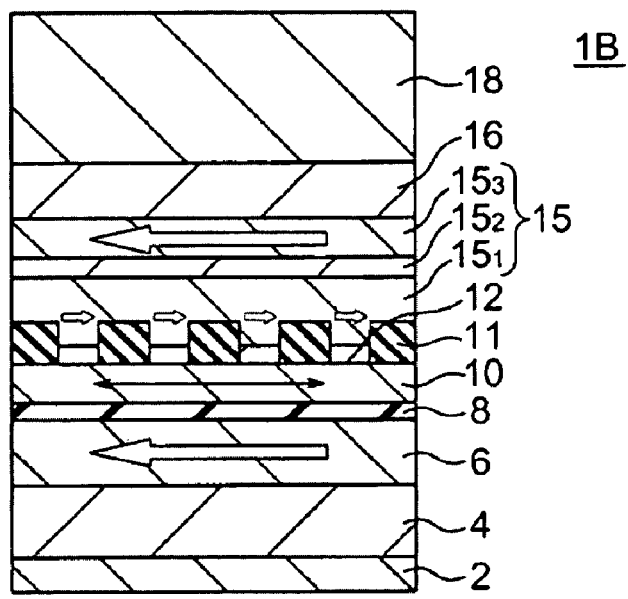
FIG. 16 is a sectional view showing a magnetoresistive effort element according to a second modification of the fourth embodiment.

Furthermore, as shown in FIG. 16, the dielectric 11 that completely divides the non-magnetic metal layer 12 may divide a part of the second magnetization pinned layer 15 (in FIG. 16, a part of the magnetic layer $15_1$) in order to regulate the resistance (second modification). In the second modification as well, effects similar to those in the present embodiment can be obtained.

Figure 17:
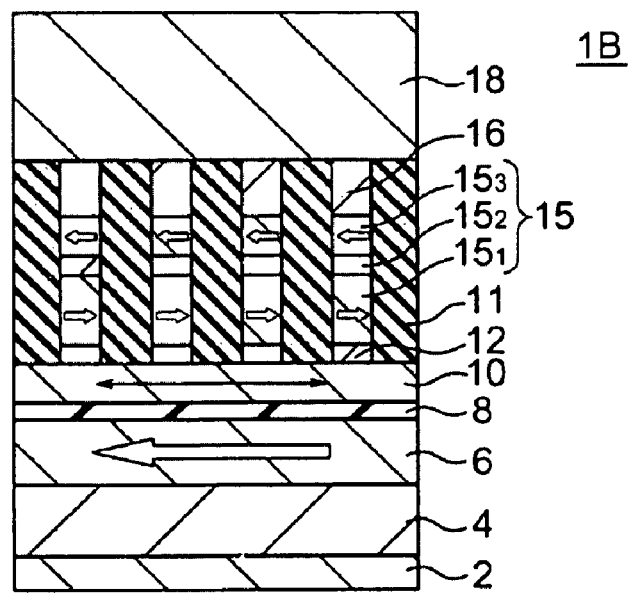
FIG. 17 is a sectional view showing a magnetoresistive effort element according to a third modification of the fourth embodiment.

In order to regulate the resistance, the dielectric 11 that completely divides the non-magnetic metal layer 12 may completely divide the second magnetization pinned layer 15 and the antiferromagnetic layer 16 as shown in FIG. 17 (third modification). In the third modification as well, effects similar to those in the present embodiment can be obtained.

In the fourth embodiment and its modifications, the second magnetization pinned layer 15 has the synthetic structure. However, the second magnetization pinned layer 15 may be a magnetic layer of a single layer. In this case, it is necessary to select a material different from the material of the ferromagnetic layer 4 as the material of the ferromagnetic layer 16.

In the fourth embodiment and its modifications, the dielectric 11 does not divide a part of the magnetic recording layer 10. However, the dielectric 11 may be configured so as to divide a part of the magnetic recording layer 10 in the same way as the fourth to seventh modifications of the first embodiment respectively shown in FIGS. 5 to 8.

Fifth Embodiment

Figure 18:
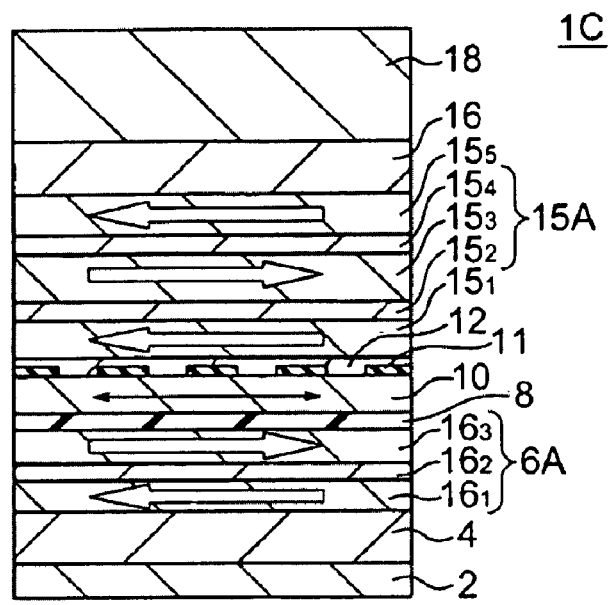
FIG. 18 is a sectional view showing a magnetoresistive effort element according to a fifth embodiment.

A magnetoresistive effect element 1C according to a fifth embodiment of the present invention is shown in FIG. 18. The magnetoresistive effect element 1C according to the present embodiment has a configuration obtained by replacing the first magnetization pinned layer 6 in the magnetoresistive effect element 1B according to the fourth embodiment shown in FIG. 14 with a synthetic first magnetization pinned layer 6A having a three-layer structure which includes a magnetic layer $6_1$, a non-magnetic layer $6_2$ and a magnetic layer $6_3$, and replacing the second magnetization pinned layer 15 with a synthetic second magnetization pinned layer 15A having a five-layer structure which includes a magnetic layer $15_1$, a non-magnetic layer $15_2$, a magnetic layer $15_3$, a non-magnetic layer $15_4$, and a magnetic layer $15_5$. The magnetic layer $6_1$ is pinned in magnetization direction by the antiferromagnetic layer 4. The magnetic layer $6_3$ is coupled to the magnetic layer $6_1$ antiferromagntically via the non-magnetic layer $6_2$. The magnetic layer $15_5$ is pinned in magnetization direction by the antiferromagnetic layer 16. The magnetic layer $15_3$ is coupled to the magnetic layer $15_5$ antiferromagntically via the non-magnetic layer $15_5$. The magnetic layer $15_1$ is coupled to the magnetic layer $15_3$ antiferromagntically via the non-magnetic layer $15_2$.

In the present embodiment, the magnetic layer $6_3$ included in the first magnetization pinned layer 6A and located nearest the magnetic recording layer 10 is substantially antiparallel in magnetization direction to the magnetic layer $15_1$ included in the second magnetization pinned layer 15A and located nearest the magnetic recording layer 10.

It is desirable to use such a synthetic magnetization pinned layer, because the magnetization pinning becomes firmer and the first and second magnetization pinned layers become more stable when spin injection writing is conducted. Furthermore, if such a magnetoresistive effect element is used as a memory element, interaction between bits is also reduced. In addition, the leak magnetic field can be suppressed to the minimum by adjusting magnitudes of magnetization (moments) of magnetic layers in the first and second magnetization pinned layers by means of film thicknesses and materials of the magnetic layer and the non-magnetic layer.

In the present embodiment as well, it is possible to obtain a highly reliable magnetoresistive effect element that operates with low power consumption and low current writing and without element destruction, in the same way as the first embodiment.

Figure 19:
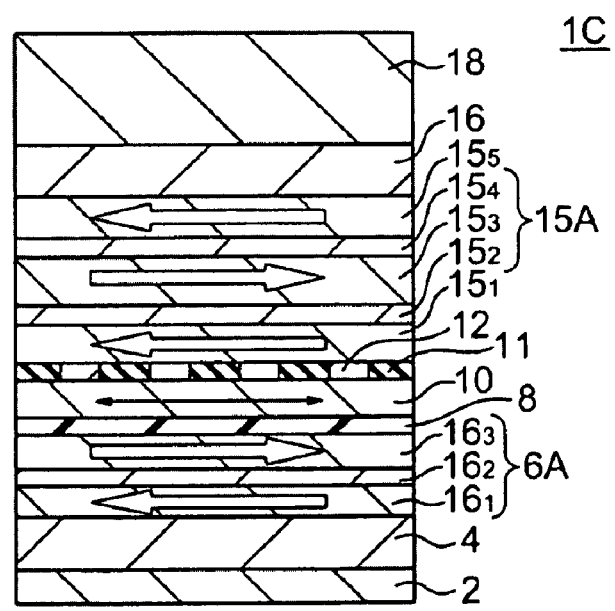
FIG. 19 is a sectional view showing a magnetoresistive effort element according to a first modification of the fifth embodiment.

In order to regulate the resistance of the non-magnetic metal layer 12, the non-magnetic metal layer 12 may be divided by the dielectric 11 not only at the interface in contact with the magnetic recording layer 10 but also on the second magnetization pinned layer 15 side as shown in FIG. 19. In other words, the non-magnetic metal layer 12 may be divided by the dielectric 11 completely (first modification). In the first modification as well, effects similar to those in the present embodiment can be obtained.

Figure 20:
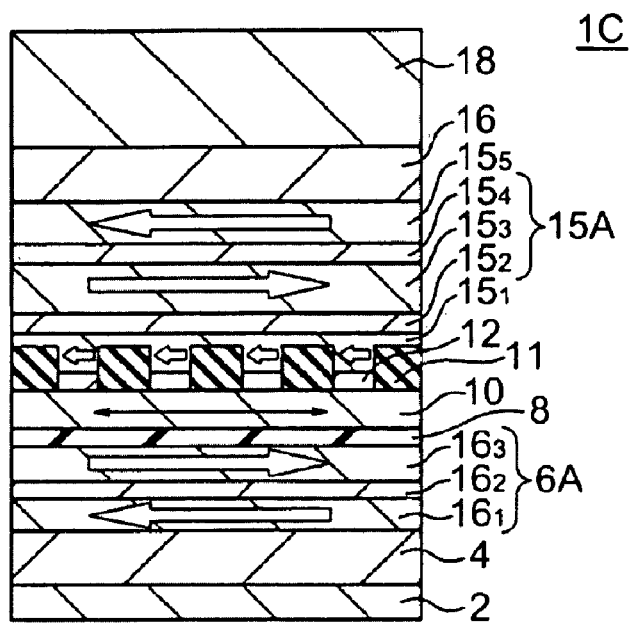
FIG. 20 is a sectional view showing a magnetoresistive effort element according to a second modification of the fifth embodiment.

Furthermore, as shown in FIG. 20, the dielectric 11 that completely divides the non-magnetic metal layer 12 may divide a part of the second magnetic pinned layer 15 (in FIG. 20, a part of the magnetic layer $15_1$) in order to regulate the resistance (second modification). In the second modification as well, effects similar to those in the present embodiment can be obtained.

Figure 21:
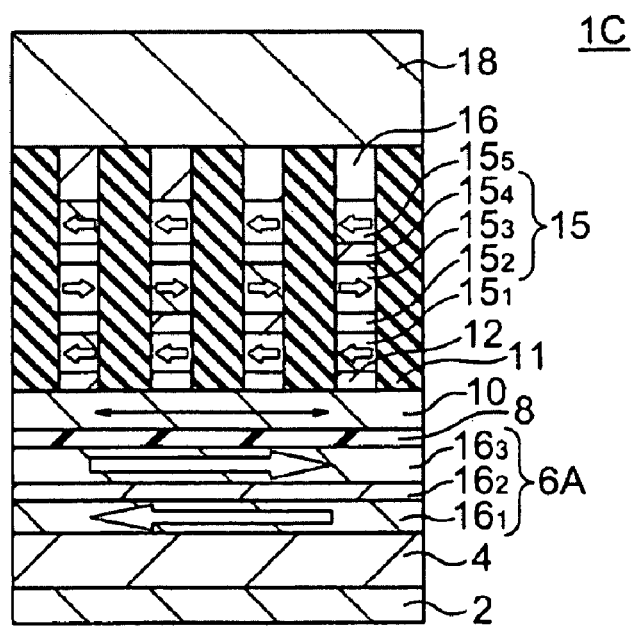
FIG. 21 is a sectional view showing a magnetoresistive effort element according to a third example of the fifth embodiment.

In order to regulate the resistance, the dielectric 11 that completely divides the non-magnetic metal layer 12 may completely divide the second magnetization pinned layer 15 and the antiferromagnetic layer 16 as shown in FIG. 21 (third modification). In the third modification as well, effects similar to those in the present embodiment can be obtained.

In the present embodiment and its first to third modifications as well, the dielectric 11 may divide a part of the magnetic recording layer 10 in the same way as the fourth to seventh modifications of the first embodiment respectively shown in FIGS. 5 to 8. In these cases as well, effects similar to those in the present embodiment can be obtained.

Sixth Embodiment

Figure 22:
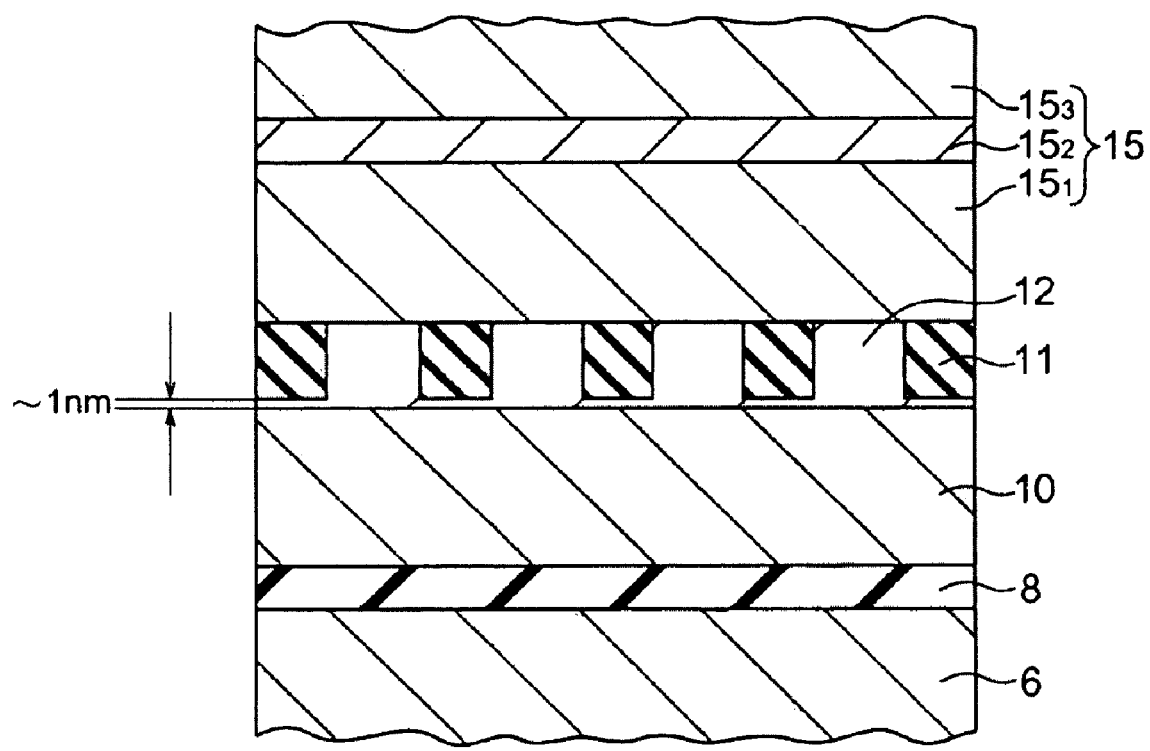
FIG. 22 is a sectional view showing a magnetoresistive effort element according to a sixth embodiment.

A magnetoresistive effect element according to a sixth embodiment of the present invention will now be described with reference to FIG. 22. The magnetoresistive effect element according to the present embodiment has a configuration in which the non-magnetic metal layer 12 is not divided by the dielectric 11 on the magnetic recording layer 10 side, but divided by the dielectric 11 on the second magnetization pinned layer 15 side in the magnetoresistive effect element according to the fourth embodiment shown in FIG. 14 (see FIG. 22).

In the present embodiment as well, at least a part of the non-magnetic metal layer 12 is divided by the dielectric 11 and consequently the current flowing through the non-magnetic metal layer 12 flows through a place that is not divided by the dielectric 11 in a concentrative manner in the same way as the fourth embodiment.

In the present embodiment as well, therefore, it becomes possible to regulate the resistance and it is possible to obtain a highly reliable magnetoresistive effect element that operates with low power consumption and low current writing and without element destruction in the same way as the first embodiment.

By the way, it is desirable that the distance between the bottom surface of the dielectric 11 and the magnetic recording layer 10 is approximately 1 nm.

The structure having a distance between the bottom surface of the dielectric 11 and the magnetic recording layer 10 as in the present embodiment may be used in the magnetoresistive effect elements according to the fourth embodiment, the second and third modifications of the fourth embodiment, the fifth embodiment, and the second and third modifications of the fifth embodiment as well.

Seventh Embodiment

Figure 23:
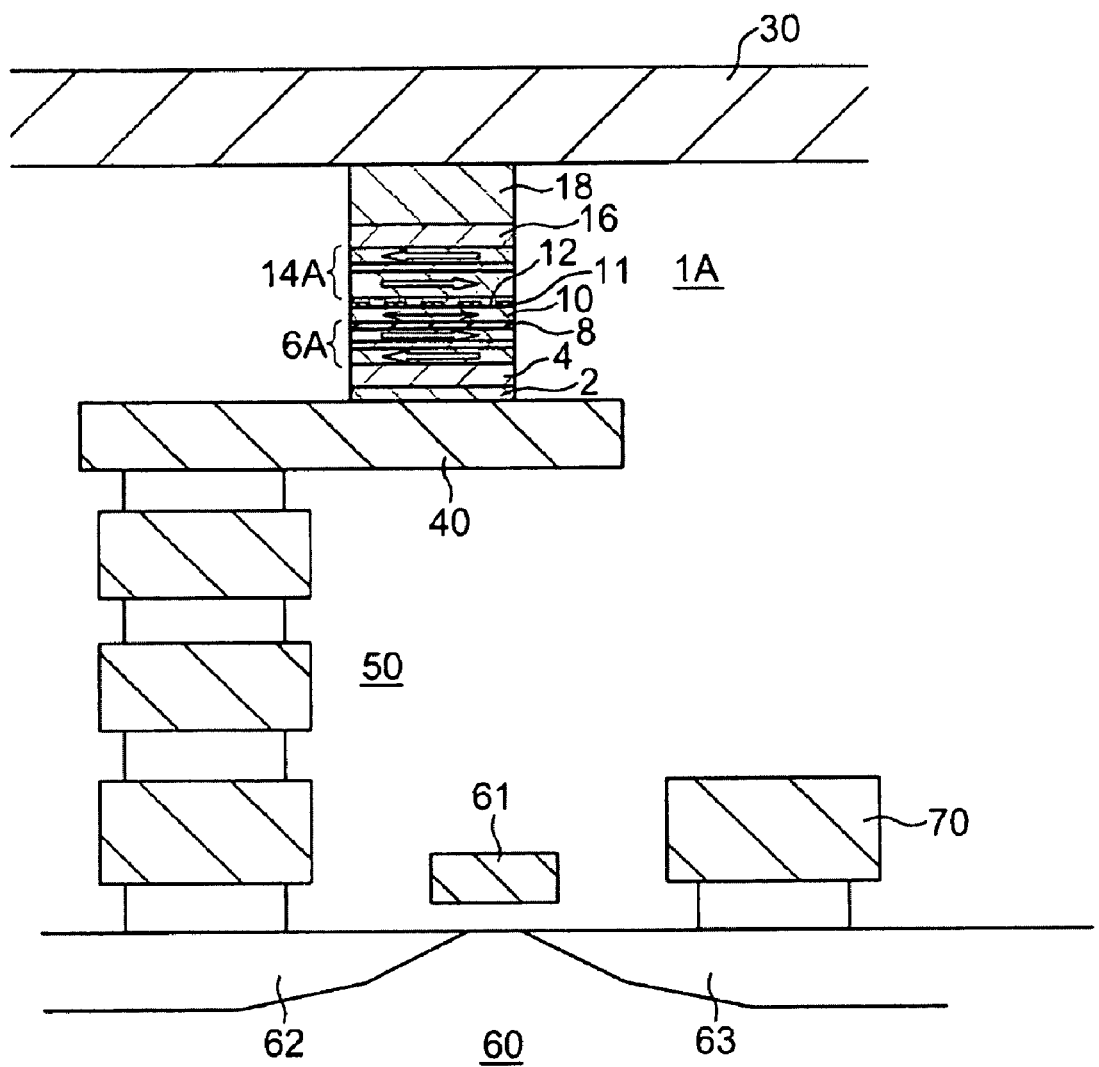
FIG. 23 is a sectional view showing a magnetic memory according to a seventh embodiment of the present invention.

A magnetic memory according to a seventh embodiment according to the present invention is shown in FIG. 23. The magnetic memory according to the present embodiment includes at least one memory cell. This memory cell includes the magnetoresistive effect element 1A according to the second embodiment and a selection transistor 60. The magnetoresistive effect element 1A includes an underlying layer 2 provided on a leading electrode 40, an antiferromagnetic layer 4 provided on the underlying layer 2, a first magnetization pinned layer 6A provided on the antiferromagnetic layer 4, a tunnel barrier layer 8 provided on the first magnetization pinned layer 6A, a magnetic recording layer 10 provided on the tunnel barrier layer 8, a non-magnetic metal layer 12 provided on the magnetic recording layer 10 and partially divided by the dielectric 11, a second magnetization pinned layer 14A provided on the non-magnetic metal layer 12, an antiferromagnetic layer 16 provided on the second magnetization pinned layer 14A, and a metal protection film 18 provided on the antiferromagnetic layer 16. By the way, a magnetic layer included in the first magnetization pinned layer 6A and located nearest the magnetic recording layer 10 is substantially parallel in magnetization direction to a magnetic layer included in the second magnetization pinned layer 14A and located nearest the magnetic recording layer 10.

The selection transistor 60 includes a gate electrode 61 and source and drain regions 62 and 63 provided on respective sides of the gate electrode. The metal protection film 18 is connected to a bit line 30 used to select a memory cell. The leading electrode 40 is connected to the source 62 of the selection transistor 60 via a connection part 50. The gate electrode 61 of the selection transistor 60 serves also as a word line used to select a memory cell. Therefore, the memory cell is provided so as to be associated with a region where the bit line 30 and the word line 61 intersect. The drain 63 of the selection transistor 60 is connected to wiring 70.

Hereafter, the spin injection writing principle in this embodiment will be described. First, a voltage is applied to the gate electrode 61 of the selection transistor 60 to turn on the selection transistor 60.

a) In the case where the spin moment of the first magnetization pinned layer 6A and the magnetic recording layer 10 is spin-inverted from antiparallel to parallel:

Electrons are injected from the first magnetization pinned layer 6A side, and electrons spin-polarized in the first magnetization pinned layer 6A tunnel the tunnel barrier layer 8 and the electrons are injected into the magnetic recording layer 10. In addition, electrons that have passed through the magnetic recording layer 10 are reflected by the second magnetization pinned layer 14A, and injected into the magnetic recording layer 10 again as reflected spin electrons. As a result, spin torque is exerted on the magnetic recording layer 10 and the spin of the magnetic recording layer 10 are inverted from antiparallel to parallel in the same way as the first embodiment.

b) In the case where the spin moment of the first magnetization pinned layer 6A and the magnetic recording layer 10 is spin-inverted from parallel to antiparallel:

If electrons are injected from the second magnetization pinned layer 14A side, then spin-polarized electrons that have passed through the second magnetization pinned layer 14A and the non-magnetic metal layer 12 are injected into the magnetic recording layer 10. The electrons that have passed through the magnetic recording layer 10 are reflected by the first magnetization pinned layer 6A via the tunnel barrier layer 8, and injected into the magnetic recording layer 10 again as reflected spin electrons. As a result, spin torque is exerted on the magnetic recording layer 10 and the spin of the magnetic recording layer 10 are inverted from parallel to antiparallel in the same way as the first embodiment.

The magnetic memory according to the present embodiment includes a magnetoresistive effect element 1A according to the second embodiment as the memory element. Therefore, the magnetic memory becomes a highly reliable magnetic memory that operates with low power consumption and low current writing and without element destruction.

Figure 24:
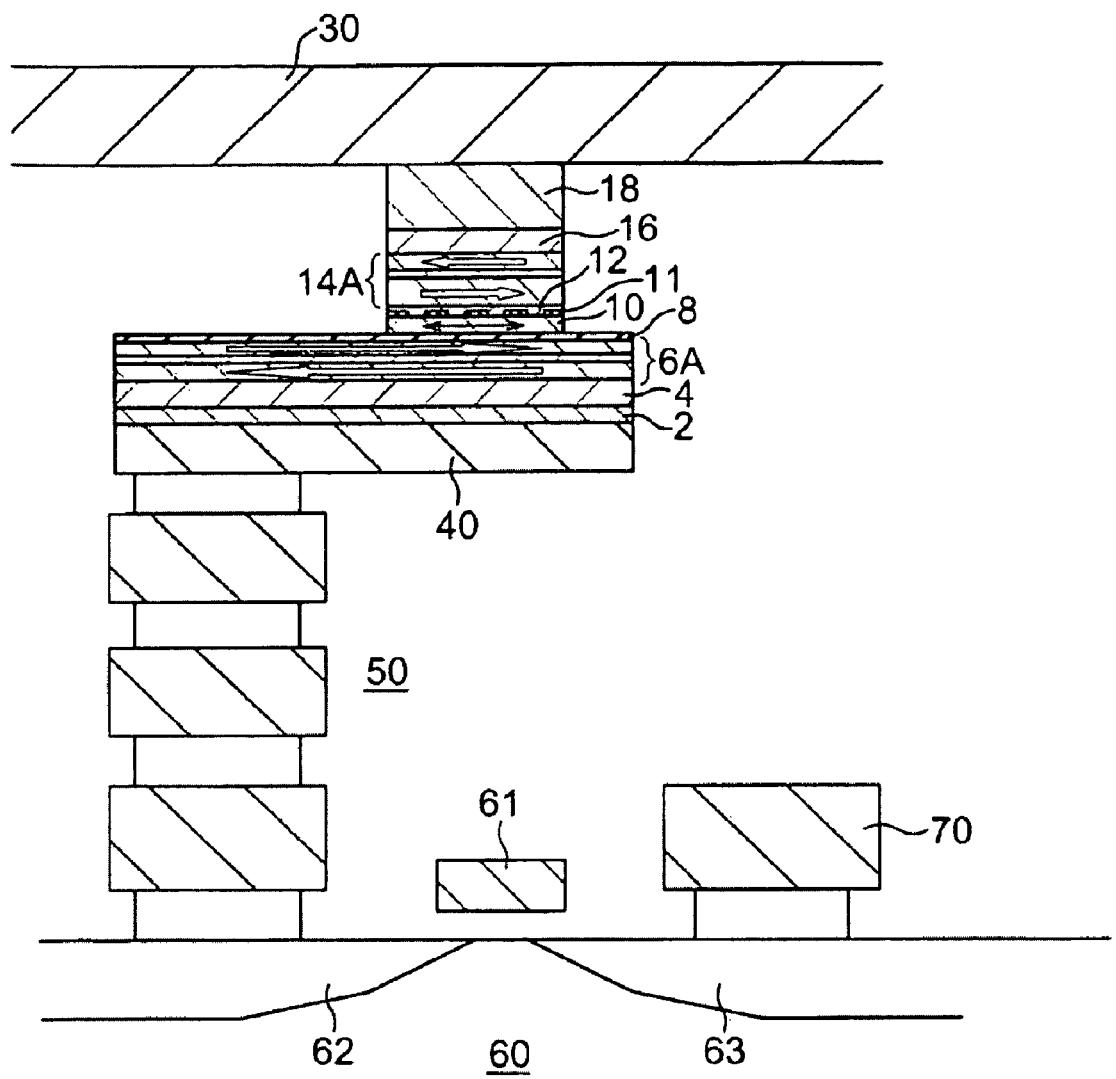
FIG. 24 is a sectional view showing a magnetic memory according to a modification of the seventh embodiment.

By the way, the volume of the first magnetization pinned layer 6A may be made large in order to maintain the magnetization stability of the magnetization pinned layer at the time of spin writing as shown in FIG. 24 (first modification). In this modification, the underlying layer 2, the antiferromagnetic layer 4, the first magnetization pinned layer 6 and the tunnel barrier layer 8 in the magnetoresistive effect element 1A shown in FIG. 23 are made large in size in film surface direction as compared with the magnetic recording layer 10 as shown in FIG. 24.

In this modification as well, it is possible to obtain a highly reliable magnetic memory that operates with low power consumption and low current writing and without element destruction in the same way as the seventh embodiment.

In the magnetic memory according to the present embodiment, the magnetoresistive effect element 1A according to the second embodiment is used as the memory element. However, the magnetoresistive effect element according to any of the first embodiment, its modifications, modifications of the second embodiment, and the third embodiment may be used as the memory element. In these cases, it becomes possible to maintain the magnetization stability of the magnetization pinned layer at the time of spin writing by making the volume of the first magnetization pinned layer large in the same way as the modification of the seventh embodiment shown in FIG. 24.

Eighth Embodiment

Figure 25:
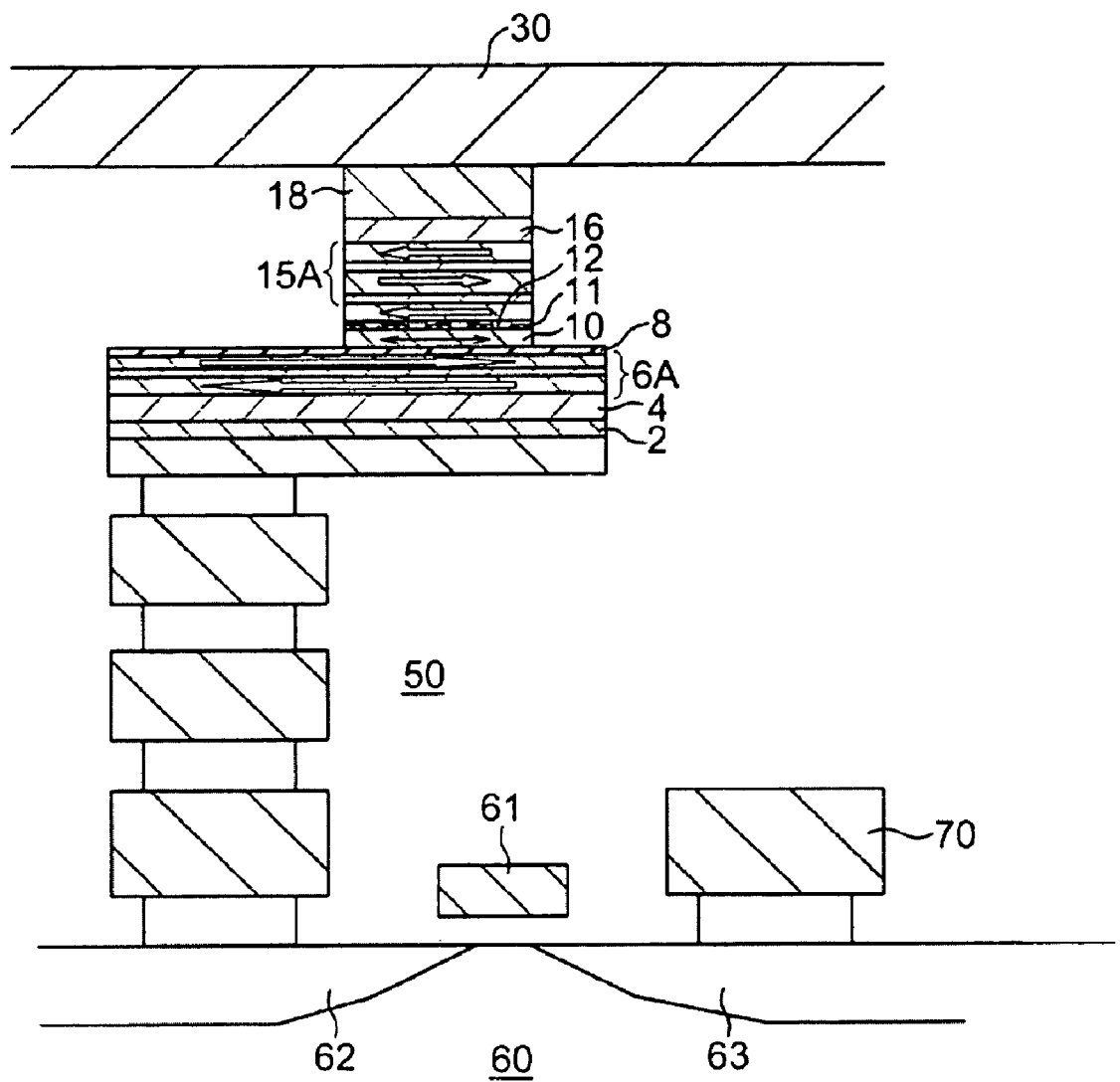
FIG. 25 is a sectional view showing a magnetic memory according to an eighth embodiment of the present invention.

A magnetic memory according to an eighth embodiment according to the present invention is shown in FIG. 25. The magnetic memory according to this embodiment has a configuration obtained by replacing the magnetoresistive effect element 1A in the magnetic memory according to the seventh embodiment shown in FIG. 23 with the magnetoresistive effect element 1C according to the fifth embodiment shown in FIG. 18. By the way, a magnetic layer included in the first magnetization pinned layer 6A and located nearest the magnetic recording layer 10 is substantially antiparallel in magnetization direction to a magnetic layer included in the second magnetization pinned layer 15A and located nearest the magnetic recording layer 10.

The magnetic memory according to this embodiment includes a magnetoresistive effect element 1C according to the fifth embodiment as the memory element. Therefore, the magnetic memory becomes a highly reliable magnetic memory that operates with low power consumption and low current writing and without element destruction.

Figure 26:
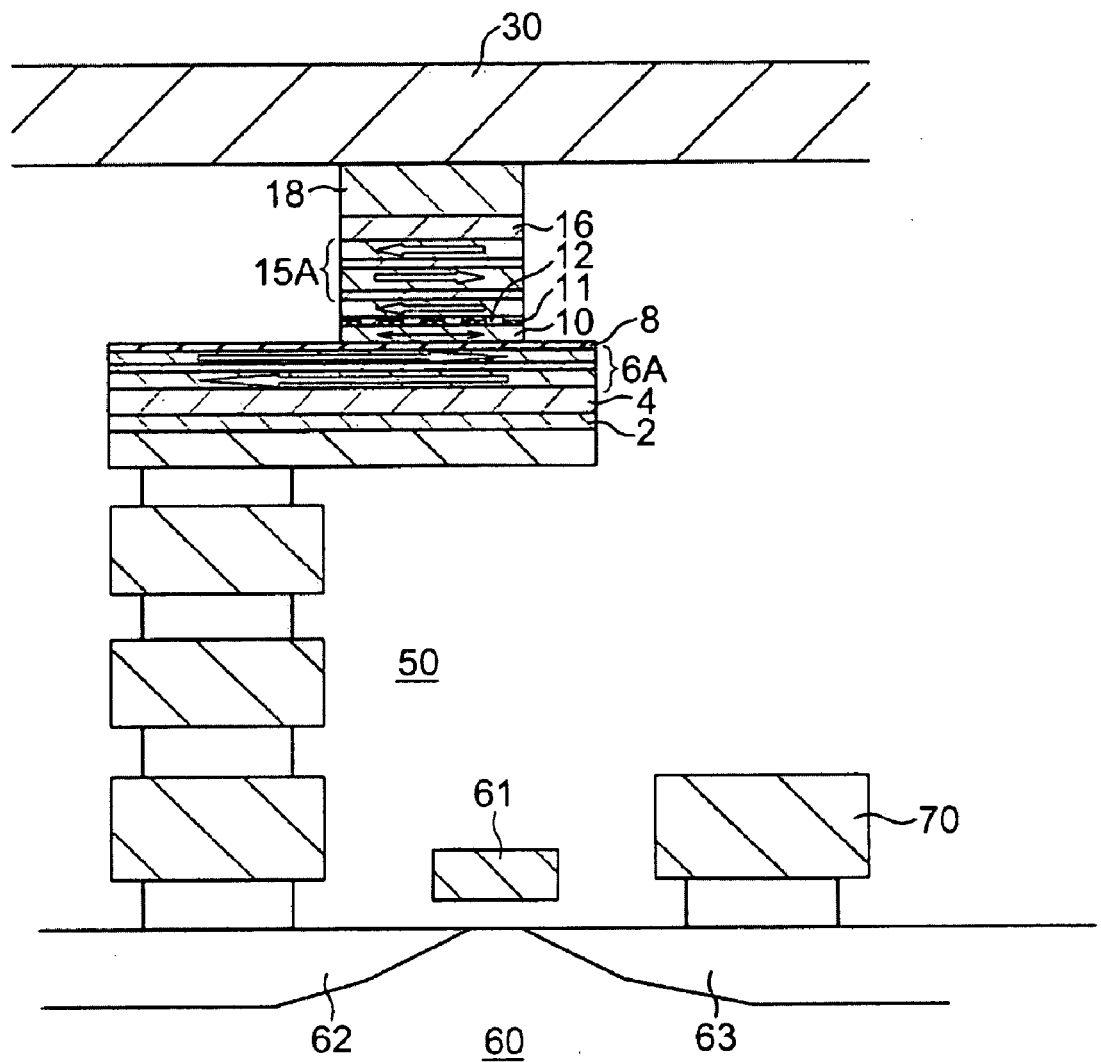
FIG. 26 is a sectional view showing a magnetic memory according to a modification of the eighth embodiment.

By the way, the volume of the first magnetization pinned layer 6A may be made large in order to maintain the magnetization stability of the magnetization pinned layer at the time of spin writing as shown in FIG. 26 (first modification). In this modification, the underlying layer 2, the antiferromagnetic layer 4, the first magnetization pinned layer 6 and the tunnel barrier layer 8 in the magnetoresistive effect element 1C shown in FIG. 25 are made large in size in film surface direction as compared with the magnetic recording layer 10 as shown in FIG. 26.

In this modification as well, it is possible to obtain a highly reliable magnetic memory that operates with low power consumption and low current writing and without element destruction in the same way as the eighth embodiment.

In the magnetic memory according to the present embodiment, the magnetoresistive effect element 1C according to the fifth embodiment is used as the memory element. However, the magnetoresistive effect element according to any of the fourth embodiment, its modifications, modifications of the fifth embodiment, and the sixth embodiment may be used as the memory element. In these cases, it becomes possible to maintain the magnetization stability of the magnetization pinned layer at the time of spin writing by making the volume of the first magnetization pinned layer large in the same way as the modification of the eighth embodiment shown in FIG. 26.

Furthermore, in the first to eighth embodiments and their modifications, it is necessary to design so as to make the volume of the whole magnetic substance in the magnetic recording layer smaller than the volume of the magnetic substance in each of the first and second magnetization pinned layers. If design is conducted so as not to satisfy the relation as to the volume of the magnetic substance, then the magnetization of the magnetization pinned layer becomes unstable due to the spin torque and false operation occurs.

In the first to eighth embodiments and their modifications, the magnetic layer in the magnetoresistive effect element is a thin film of at least one kind or a multilayer film formed using a material selected from a group including a Co—Fe alloy, a Co—Fe—Ni alloy, a (Co, Fe, Ni)—(Si, B) alloy, a (Co, Fe, Ni)—(B) amorphous alloy, and an amorphous material such as a Co—(Zr, Hf, Nb, Ta, Ti) film, and a Heusler alloy such as $CO_2$(Cr—Fe)Al, $CO_2$MnAl and $CO_2$MnSi. The magnetic layer may be provided with a Ni—Fe alloy such as a Permalloy alloy.

It is desirable that the magnetic layer has unidirectional anisotropy as the magnetization pinned layer and has uniaxial anisotropy as the magnetic recording layer. Its thickness is desired to be in the range of 0.1 nm to 100 nm. In addition, the magnetic layer (ferromagnetic layer) included in the magnetization pinned layer and the magnetic recording layer needs to have a thickness capable of preventing the magnetic layer from having super-paramagnetism. It is more desirable that the thickness is 0.4 nm or more.

Furthermore, it is desirable to add an antiferromagnetic film to the ferromagnetic layer used as the magnetization pinned layer to pin the magnetization. As such an antiferromagnetic film, magnetic substances such as a Fe (iron)-Mn (manganese) alloy, a Pt (platinum)-Mn (manganese) alloy, a Pt (platinum)-Cr (chromium)-Mn (manganese) alloy, a Ni (nickel)-Mn (manganese) alloy, an Ir (iridium)-Mn (manganese) alloy, NiO (nickel oxide), and CoO (cobalt oxide) can be mentioned.

It is possible to adjust magnetic characteristics and adjust various physical properties such as the crystal property, mechanical characteristics, and chemical characteristics by adding non-magnetic elements such as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to these magnetic substances.

Specifically, as a method for pinning the magnetic layer in one direction, a laminated film having a three-layer structure including Co(Co—Fe)/Ru (ruthenium)/Co(Co—Fe), a laminated film having a three-layer structure including Co(Co—Fe)/Ir (iridium)/Co(Co—Fe), a laminated film having a three-layer structure including Co(Co—Fe)/Os (osmium)/Co(Co—Fe), a laminated film having a three-layer structure including Co(Co—Fe)/Re (rhenium)/Co(Co—Fe), a laminated film having a three-layer structure including a Co—Fe—B amorphous material layer/Ru (ruthenium)/a Co—Fe—B amorphous material layer, a laminated film having a three-layer structure including an amorphous material layer of Co—Fe—B or the like/Ir (iridium)/an amorphous material layer of Co—Fe—B or the like, a laminated film having a three-layer structure including an amorphous material layer of Co—Fe—B or the like/Os (osmium)/an amorphous material layer of Co—Fe—B or the like, or a laminated film having a three-layer structure including an amorphous material layer of Co—Fe—B or the like/Re (rhenium)/an amorphous material layer of Co—Fe—B or the like is used. When these laminated films are used as the magnetization pinned layer, it is desirable to provide an antiferromagnetic film adjacent to the magnetization pinned layer. As the antiferromagnetic film in this case as well, Fe—Mn, Pt—Mn, Pt—Cr—Mn, Ni—Mn, Ir—Mn, NiO, CoO or the like can be used in the same way as the foregoing description. If this structure is used, the magnetization in the magnetization pinned layer is more insusceptible to the influence of the current magnetic field from the bit line or word line and the magnetization is pinned firmly. Furthermore, a stray field from the magnetization pinned layer can be weakened (or adjusted). And the magnetization shift of the magnetic recording layer can be adjusted by changing the thickness of the two ferromagnetic layers that form the magnetization pinned layer.

As the magnetic recording layer, a two-layer structure represented as a soft magnetic layer/ferromagnetic layer or a three-layer structure represented as a ferromagnetic layer/a soft magnetic layer/a ferromagnetic layer may also be used. A more favorable effect is obtained by controlling the intensity of interaction between ferromagnetic layers using a three-layer structure represented as a ferromagnetic layer/a non-magnetic layer/a ferromagnetic layer or a five-layer structure represented as a ferromagnetic layer/a non-magnetic layer/a ferromagnetic layer/a non-magnetic layer/a ferromagnetic layer. That is, it is not necessary to increase the power consumption of the current magnetic field even if the cell width of the magnetic recording layer which is the memory cell is sub-micron or less. At this time, it doesn't matter if the kind and film thickness of the ferromagnetic layer are changed.

In particular, if Co—Fe, Co—Fe—Ni, or Fe rich Ni—Fe having a large MR ratio is used in the ferromagnetic layer located near the insulation barrier (tunnel barrier layer) and Ni rich Ni—Fe, Ni rich Ni—Fe—Co or the like is used in the ferromagnetic substance that is not in contact with the tunnel barrier layer, then the switching magnetic field can be weakened while keeping the MR ratio at a large value. It is more favorable.

In the magnetic recording layer as well, It is possible to adjust magnetic characteristics and adjust various physical properties such as the crystal property, mechanical characteristics, and chemical characteristics by adding non-magnetic elements such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to these magnetic substances.

On the other hand, when a TMR element is used as the magnetoresistive effect element, it is possible to use various insulators (dielectrics) such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium oxide strontium), $AlLaO_3$ (lanthanum oxide aluminum) and Al—N—O (aluminum oxide nitride), as the tunnel barrier layer (or dielectric layer) provided between the magnetization pinned layer and the magnetic recording layer.

It is not necessary that these compounds have a completely accurate composition from the view of stoichiometry. Loss, excess, or insufficiency of oxygen, nitrogen, fluorine or the like may exist. It is desirable that the thickness of the insulation layer (dielectric layer) is thin to the extent that the tunnel current flows. As a matter of fact, it is desirable that the thickness is 10 nm or less.

Such a magnetoresistive effect element can be formed on a predetermined substrate by using ordinary thin film forming means such as various sputter methods, the evaporation method, or the molecular beam epitaxy method. As the substrate in this case, various substrates such as Si (silicon), $SiO_2$ (silicon oxide), $Al_2O_3$ (aluminum oxide), spinel and AlN (aluminum nitride) substrates can be used.

Furthermore, a layer formed of Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)-Cu (copper), Ru (ruthenium), Ir (iridium), or Os (osmium) may be provided on the substrate as the underlying layer, protection layer or hard mask.

It is a matter of course that in the seventh and eighth embodiments a sense current control element circuit, a driver and a sinker which control a sense current let flow through the magnetoresistive effect element in order to read out information stored by the magnetoresistive effect element are further included.

Figure 32:
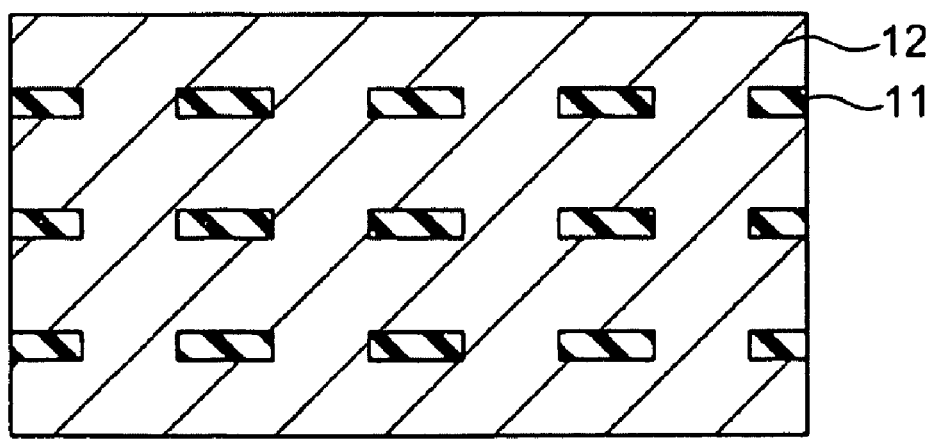
FIG. 32 is a horizontal sectional view showing another example of an arrangement relation between a non-magnetic metal layer and a dielectric.

In the above-described embodiments, the non-magnetic metal layer 12 and the dielectric 11 have the pattern in which the non-magnetic metal layer 12 is arranged in the dielectric 11 regularly as shown in FIG. 31 and described with reference to the first embodiment. However, a pattern in which the non-magnetic metal layer 12 is arranged in the dielectric 11 at random. Alternatively, a pattern in which the dielectric 11 is arranged in the non-magnetic metal layer 12 regularly as shown in FIG. 32 or a pattern in which the dielectric 11 is arranged in the non-magnetic metal layer 12 at random may be used.

Hereafter, examples of the present invention will be described in more detail with reference to examples.

FIRST EXAMPLE

Figure 27:
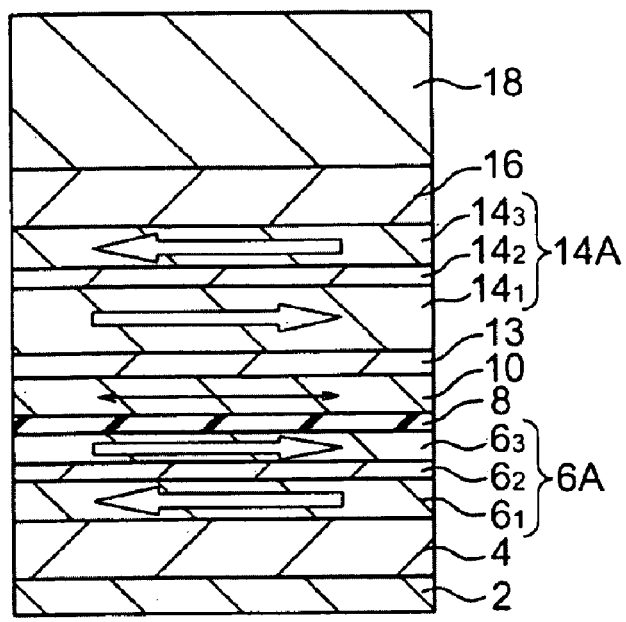
FIG. 27 is a sectional view showing a magnetoresistive effect element according to a comparative example.
Figure 28:
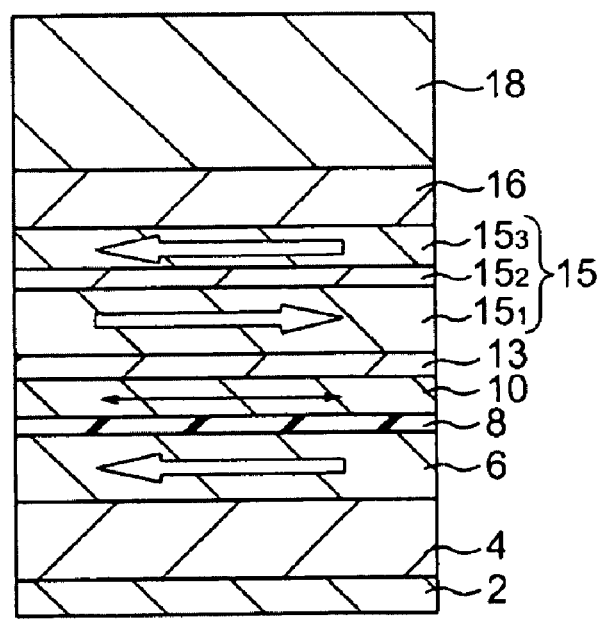
FIG. 28 is a sectional view showing a magnetoresistive effect element according to a comparative example.

First, as a first example of the present invention, the magnetoresistive effect element 1A according to the second embodiment shown in FIG. 9 and the magnetoresistive effect element 1B according to the fourth embodiment shown in FIG. 14 are fabricated as a first sample and a second sample. As a comparative example, magnetoresistive effect elements having structures respectively shown in FIG. 27 and FIG. 28 are fabricated as a first comparative sample and a second comparative sample at the same time. These samples are compared in terms of the spin inversion current. In the magnetoresistive effect elements respectively having structures shown in FIG. 27 and FIG. 28, the non-magnetic metal layer is not divided by the dielectric, but is a continuous film unlike the magnetoresistive effect elements shown in FIG. 9 and FIG. 14.

Hereafter, a structure of the magnetoresistive effect element according to the first example will be described along its manufacture procedure.

As the first sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) provided on a substrate, as shown in FIG. 9.

As the second sample, a TMR film, i.e., a laminated film including an underlying layer/an antiferromagnetic layer/a magnetic layer/a tunnel barrier layer/a magnetic layer/a non-magnetic metal layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 14.

As the first comparative sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 27.

As the second comparative sample, a TMR film, i.e., a laminated film including an underlying layer/an antiferromagnetic layer/a magnetic layer/a tunnel barrier layer/a magnetic layer/a non-magnetic metal layer/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 28.

In the present example, all of lower wiring is formed of Ta/Cu/Ta and the underlying layer is formed of Ru. In the TMR film of the first sample, PtMn (14 nm) is used as the antiferromagnetic layer, $Co_{90}Fe_{10}$ (3 nm)/Ru (0.85 nm)/$Co_{90}Fe_{10}$ (4 nm) is used as the first magnetization pinned layer, AlOx (1.4 nm) is used as the tunnel barrier layer, $(Co_{90}Fe_{10})_{80}B_{20}$ (3 nm) is used as the magnetic recording layer, AlOx (0.7 nm) is used as the dielectric which divides the non-magnetic metal layer, Ru (5 nm) is used as the non-magnetic metal layer, $Co_{90}Fe_{10}$ (4 nm)/Ru (0.85 nm)/$Co_{90}Fe_{10}$ (3 nm) is used as the second magnetization pinned layer, and PtMn (14 nm) is used as the antiferromagnetic layer in order from the bottom. The numerical value in ( ) indicates the film thickness.

In the TMR film of the second sample, PtMn (14 nm) is used as the antiferromagnetic layer, $Co_{90}Fe_{10}$ (3 nm) is used as the first magnetization pinned layer, AlOx (1.4 nm) is used as the tunnel barrier layer, $(Co_{90}Fe_{10})_{80}B_{20}$ (3 nm) is used as the magnetic recording layer, AlOx (0.7 nm) is used as the dielectric which divides the non-magnetic metal layer, Cu (5 nm) is used as the non-magnetic metal layer, $Co_{90}Fe_{10}$ (4 nm)/Ru (0.85 nm)/$Co_{90}Fe_{10}$ (3 nm) is used as the second magnetization pinned layer, and PtMn (14 nm) is used as the antiferromagnetic layer in order from the bottom. The numerical value in ( ) indicates the film thickness.

AlOx (0.7 nm) used as the dielectric which divides the non-magnetic metal layer is fabricated by forming a film of Al in an island form and then conducting natural oxidation in si-tu. The tunnel barrier layer formed of AlOx (1.4 nm) is fabricated by forming a film of Al (0.7 nm) and conducting natural oxidation, and then forming a film of Al (0.7 nm) and conducting natural oxidation again. In other words, the dielectric which divides the magnetic recording layer, and the tunnel barrier layer are natural oxidation dielectrics.

In the TMR film of the first comparative sample according to a comparative example, PtMn (14 nm) is used as the antiferromagnetic layer, $Co_{90}Fe_{10}$ (3 nm)/Ru (0.85 nm)/$Co_{90}Fe_{10}$ (4 nm) is used as the first magnetization pinned layer, AlOx (1.4 nm) is used as the tunnel barrier layer, $(Co_{90}Fe_{10})_{80}B_{20}$ (3 nm) is used as the magnetic recording layer, Ru (5 nm) is used as the non-magnetic metal layer, $Co_{90}Fe_{10}$ (4 nm)/Ru (0.85 nm)/$Co_{90}Fe_{10}$ (3 nm) is used as the second magnetization pinned layer, and PtMn (14 nm) is used as the antiferromagnetic layer.

In the TMR film of the second comparative sample, PtMn (14 nm) is used as the antiferromagnetic layer, $Co_{90}Fe_{10}$ (3 nm) is used as the first magnetization pinned layer, AlOx (1.4 nm) is used as the tunnel barrier layer, $(Co_{90}Fe_{10})_{80}B_{20}$ (3 nm) is used as the magnetic recording layer, Cu (5 nm) is used as the non-magnetic metal layer, $Co_{90}Fe_{10}$ (4 nm)/Ru (0.85 nm)/$Co_{90}Fe_{10}$ (3 nm) is used as the second magnetization pinned layer, and PtMn (14 nm) is used as the antiferromagnetic layer.

In all samples, a cap layer formed of Ru (5 nm) and a hard mask layer formed of Ta (300 nm) are formed on the top surface of the TMR film.

Thereafter, the TMR elements of the first example and the comparative example are annealed in a magnetic field at 270° C. Then the TMR elements are coated with a resist, and etching is conducted. Then the resist is subjected to slimming using an ozone flow at 140° C. Ta is etched using the slimmed resist as a mask and using $SF_6$ gas according to the RIE method. This etching is stopped by the cap layer formed of Ru. Thereafter, the resist is peeled off. Junction separation of the ferromagnetic tunnel junction is conducted using the Ta as a hard mask and using milling or the RIE (Reactive Ion Etching) method as far as the tunnel barrier layer. Both the first example and the comparative example have a junction size of $0.1 \times 0.18 \ \mu m^2$.

Thereafter, an SiOx protection film is formed, and coated with a resist. The resist is patterned to form a resist pattern. The lower electrode is patterned using this resist pattern as a mask and using the RIE method. Thereafter, the resist pattern is removed, and an interlayer insulation film formed of SiOx is formed. Then, etching back and planarization are conducted. In addition, the Ta hard mask layer in the upper part of the TMR film is subjected to head exposure. Then, sputter etching is conducted, and wiring is sputtered. The wiring is formed by conducting etch back using the RIE method. Thereafter, a magnetic field is applied to the long axis direction of the magnetic layer in order to conduct annealing in the magnetic field.

Figure 29:
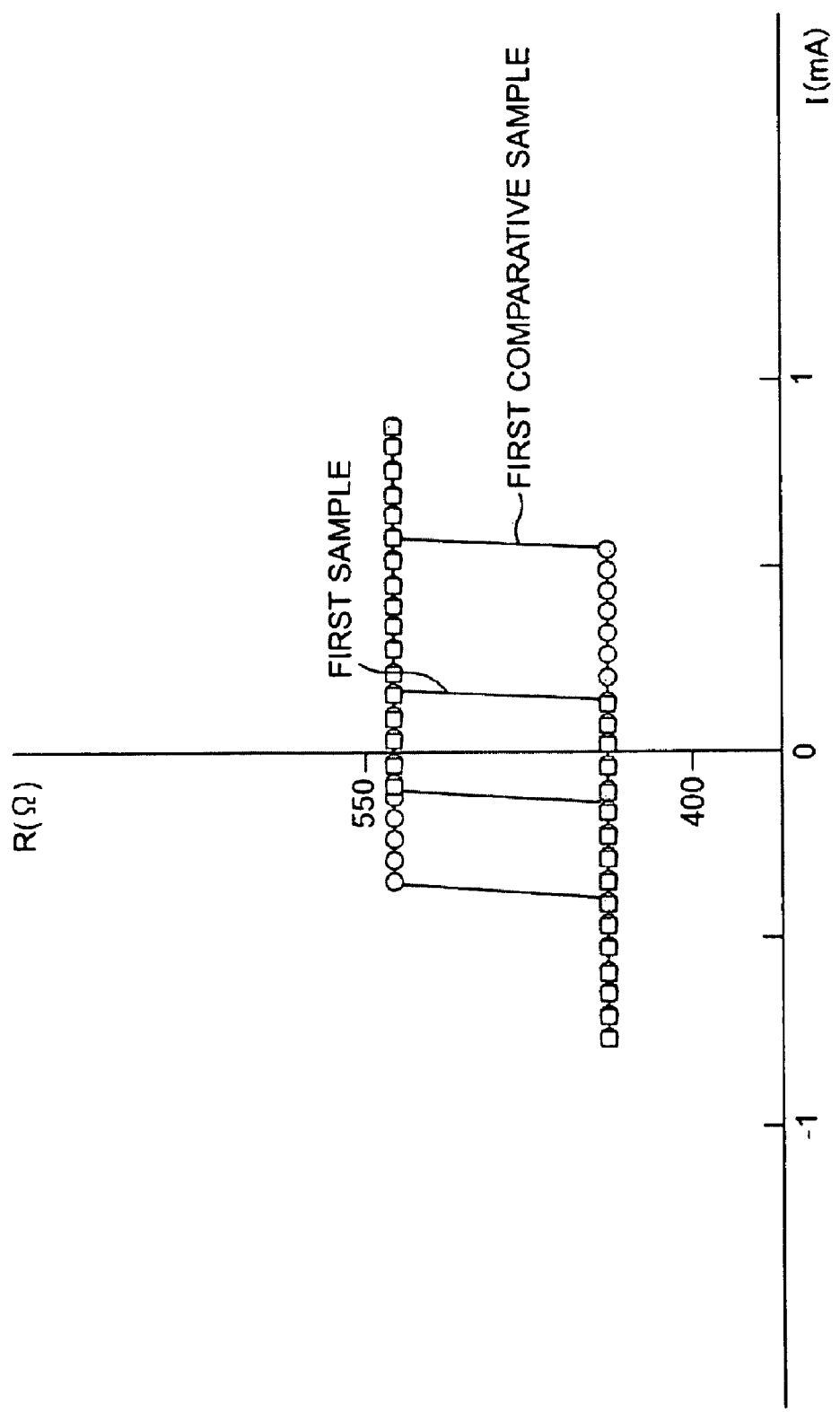
FIG. 29 is a diagram showing spin inversion characteristics of a first sample according to a first example and a first comparison sample of a comparison example at time of writing.
Figure 30:
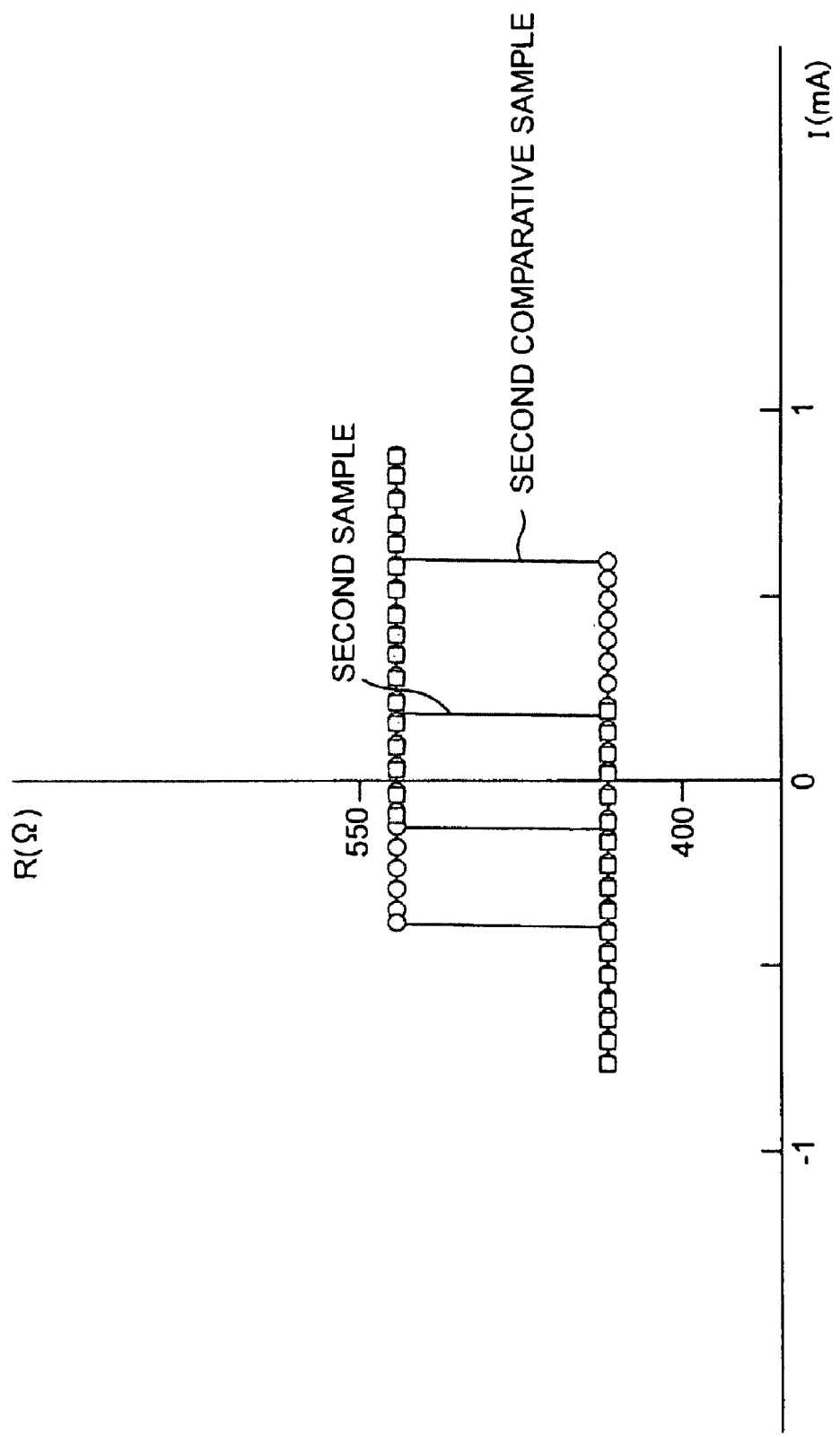
FIG. 30 is a diagram showing spin inversion characteristics of a second sample according to a first example and a second comparison sample of a comparison example at time of writing.

A 200 nm pulse current is applied to the first sample, the first comparative sample, the second sample, and the second comparative sample, and a current (mA) at which the spin is inverted is checked. As shown in FIG. 29 and FIG. 30, the spin is inverted at 0.15 mA in the first sample, at 0.5 mA in the first comparative sample, at 0.17 mA in the second sample, and at 0.55 mA in the second comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained.

SECOND EXAMPLE

As a second example of the present invention, the magnetoresistive effect element 1A according to the first modification of the second embodiment shown in FIG. 10 and the magnetoresistive effect element 1B according to the first modification of the fourth embodiment shown in FIG. 15 are fabricated respectively as a third sample and a fourth sample. As a comparative example, magnetoresistive effect elements having structures respectively shown in FIG. 27 and FIG. 28 are fabricated as a third comparative sample and a fourth comparative sample at the same time. These samples are compared in terms of the spin inversion current.

Hereafter, a structure of the magnetoresistive effect element according to the second example will be described along its manufacture procedure.

As the third sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) provided on a substrate, as shown in FIG. 10. The TMR element corresponding to this configuration is used as the third sample.

As the fourth sample, a TMR film, i.e., a laminated film including an underlying layer/an antiferromagnetic layer/a magnetic layer/a tunnel barrier layer/a magnetic layer/a non-magnetic metal layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 15.

In the present example, all of lower wiring is formed of Ta/Cu/Ta and the underlying layer is formed of Ru.

In the TMR film of the third sample, PtMn (14 nm) is used as the antiferromagnetic layer, $Co_{70}Fe_{30}$ (4 nm)/Ru (0.85 nm)/$Co_{70}Fe_{30}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, AlOx is used as the dielectric layer which divides the non-magnetic metal layer, Ru (5 nm) is used as the non-magnetic metal layer, $Co_{70}Fe_{30}$ (4 nm)/Ru (0.85 nm)/$Co_{70}Fe_{30}$ (3 nm) is used as the second magnetization pinned layer, and PtMn (14 nm) is used as the antiferromagnetic layer in order from the bottom.

In the TMR film of the fourth sample, PtMn (14 nm) is used as the antiferromagnetic layer, $Co_{70}Fe_{30}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, AlOx (0.7 nm) is used as the dielectric which divides the non-magnetic metal layer, Au (5 nm) is used as the non-magnetic metal layer, $Co_{70}Fe_{30}$ (4 nm)/Ru (0.85 nm)/$Co_{70}Fe_{30}$ (3 nm) is used as the second magnetization pinned layer, and PtMn (14 nm) is used as the antiferromagnetic layer in order from the bottom.

AlOx (0.7 nm) used as the dielectric which divides the non-magnetic metal layer is fabricated by using a patterned self-aligned process. Hereafter, the patterned self-aligned process will be described briefly.

In the TMR film of the third sample, the antiferromagnetic layer formed of PtMn (14 nm), the first magnetization pinned layer formed of $Co_{70}Fe_{30}$ (4 nm)/Ru (0.85 nm)/$Co_{70}Fe_{30}$ (4 nm), the tunnel barrier layer formed of MgO (1.0 nm), the magnetic recording layer formed of $(Co_{70}Fe_{30})_{80}B_{20}$ (3 nm), and the non-magnetic metal layer formed of Ru (5 nm) are formed in order from the bottom.

In the TMR film of the fourth sample, the antiferromagnetic layer formed of PtMn (14 nm), the magnetization pinned layer formed of $Co_{70}Fe_{30}$ (4 nm), the tunnel barrier layer formed of MgO (1.0 nm), the magnetic recording layer formed of $(Co_{70}Fe_{30})_{80}B_{20}$ (3 nm), and the non-magnetic metal layer formed of Au (5 nm) are formed in order from the bottom.

Thereafter, diblock copolymer dissolved in an organic solvent is formed using the spin coat method.

Subsequently, annealing is conducted in vacuum at a temperature in the range of approximately 140 to 200° C. for hours as long as approximately 30 hours. Thereupon, phase separation is caused in diblock copolymer by self-organization during annealing. Sea-island structures each including a diblock polymer portion having a size in the range of 15 to 30 nm are aligned at intervals of several tens nm.

Thereafter, the sample is exposed to oxygen plasma, and only the diblock polymer portions are removed selectively. Holes are opened in portions with the diblock polymer portions removed.

Subsequently, the sample is coated with SOG (spin on glass) diluted in lactic acid by using the spin coat method. SOG is embedded in the holes. The non-magnetic metal layer Ru or Au is patterned using an etching mask formed of SOG and ion milling.

In the pattern forming method using this self-organization phenomenon, a pattern having a large area can be formed inexpensively in a short time as compared with ordinary pattern forming methods such as the EB drawing, photolithography, X-ray lithography, near-field optical lithography, interference exposure method, and FIB (Focused Ion Beam). The sea-island structures have a diameter in the range of approximately 15 nm to 80 nm. A size conforming to the above-described condition can be implemented.

Subsequently, immediately after the etching mask is removed, a protection film formed of AlOx or SiOx is formed.

Subsequently, a film of $Al_2O_3$ is formed. The whole surface of the $Al_2O_3$ film is coated with an OFR resist, and etch back is conducted to expose the surface of the non-magnetic metal layer.

Subsequently, in the TMR film of the third sample, the magnetization pinned layer formed of $Co_{70}Fe_{30}$ (4 nm)/Ru (0.85 nm)/$Co_{70}Fe_{30}$ (3 nm) and the antiferromagnetic layer formed of PtMn (14 nm) are formed. In the TMR film of the fourth sample, the magnetization pinned layer formed of $Co_{70}Fe_{30}$ (4 nm)/Ru (0.85 nm)/$Co_{70}Fe_{30}$ (3 nm) and the antiferromagnetic layer formed of PtMn (14 nm) are formed.

In all samples, the cap layer formed of Ru (5 nm) and the hard mask layer formed of Ta (300 nm) are formed. A subsequent processing method is the same as that in the first example.

As a result, the magnetoresistive effect elements according to the present example are manufactured.

Furthermore, a third comparative sample and a fourth comparative sample are fabricated. The third comparative sample and the fourth comparative sample are samples obtained by forming the non-magnetic metal layer in the third sample and the fourth sample as a continuous film without conducting patterning.

Both the second example and the comparative example have a junction size of 0.1×0.18 μm². After the fabrication, a magnetic field is applied to the long axis direction of the magnetic layer at 350° C. in order to conduct annealing in the magnetic field.

A 200 nm pulse current is applied to the third sample, the third comparative sample, the fourth sample, and the fourth comparative sample, and a current (mA) at which the spin is inverted is checked. As a result, the spin is inverted at 0.07 mA in the third sample, at 0.24 mA in the third comparative sample, at 0.06 mA in the fourth sample, and at 0.28 mA in the fourth comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained.

THIRD EXAMPLE

Self-Aligned Process

As a third example of the present invention, the magnetoresistive effect element 1A according to the second modification of the second embodiment shown in FIG. 11 and the magnetoresistive effect element 1C according to the second modification of the fifth embodiment shown in FIG. 20 are fabricated respectively as a fifth sample and a sixth sample. As a comparative example, a magnetoresistive effect element having a structure shown in FIG. 27 is fabricated. In addition, in the magnetoresistive effect element having the structure shown in FIG. 28, the first magnetization pinned layer 6 is formed as a three-layer structure represented as a magnetic layer/a non-magnetic layer/a magnetic layer and the second magnetization pinned layer 15 is formed as a five-layer structure represented as a magnetic layer/a non-magnetic layer/a magnetic layer/a non-magnetic layer/a magnetic layer. In this way, a sixth comparative sample is fabricated. These samples are compared in terms of the spin inversion current.

As to the structure of the magnetoresistive effect element according to the third example, its manufacturing method is the same as that in the second example.

As the fifth sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) provided on a substrate, as shown in FIG. 11.

As the sixth sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer divided by a dielectric/a magnetic layer/a non-magnetic layer/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 20.

In the present example, all of lower wiring is formed of Ta/Cu/Ta and all of the underlying layer is formed of Ru. In the TMR film of the fifth sample, PtMn (14 nm) is used as the antiferromagnetic layer, $Co_{70}Fe_{30}$ (4 nm)/Ru (0.85 nm)/$(Co_{70}Fe_{30})_{80}B_{20}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, AlOx is used as the dielectric layer which divides the non-magnetic metal layer and the magnetic layer, Ru (5 nm) is used as the non-magnetic metal layer divided by the dielectric, $Co_{70}Fe_{30}$ (3 nm) is used as the magnetic layer divided by the dielectric in the second magnetization pinned layer, $Co_{70}Fe_{30}$ (2 nm)/Ru (0.85 nm)/$Co_{70}Fe_{30}$ (3 nm) is used as the remaining second magnetization pinned layer, and PtMn (14 nm) is used as the antiferromagnetic layer in order from the bottom.

In the TMR film of the sixth sample, PtMn (14 nm) is used as the antiferromagnetic layer, $Co_{70}Fe_{30}$ (3 nm)/Ru (0.85 nm)/$(Co_{70}Fe_{30})_{80}B_{20}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, AlOx (0.7 nm) is used as the dielectric which divides the non-magnetic metal layer and the magnetic layer, Au (5 nm) is used as the non-magnetic metal layer, a $Co_{70}Fe_{30}$ layer (3 nm) is used as the magnetic layer in the second magnetization pinned layer divided by the dielectric, $Co_{70}Fe_{30}$ (4 nm)/Ru (0.85 nm)/$Co_{70}Fe_{30}$ (3 nm)/Ru (0.85 nm)/$Co_{70}Fe_{30}$ (3 nm) is used as the remaining second magnetization pinned layer, and PtMn (14 nm) is used as the antiferromagnetic layer in order from the bottom.

AlOx (0.7 nm) used as the dielectric which divides the non-magnetic metal layer is fabricated by using a patterned self-aligned process. Its fabrication method is nearly the same as that in the second example.

Furthermore, a fifth comparative sample and a sixth comparative sample are fabricated. The fifth comparative sample and the sixth comparative sample are samples obtained by forming the non-magnetic metal layer in the fifth sample and the sixth sample as a continuous film without conducting patterning.

Both the third example and the comparative example have a junction size of 0.1×0.18 µm$^2$. After the fabrication, a magnetic field is applied to the long axis direction of the magnetic layer at 350° C. in order to conduct annealing in the magnetic field.

A 200 nm pulse current is applied to the fifth sample, the fifth comparative sample, the sixth sample, and the sixth comparative sample, and a current (mA) at which the spin is inverted is checked. As a result, the spin is inverted at 0.065 mA in the fifth sample, at 0.23 mA in the fifth comparative sample, at 0.062 mA in the sixth sample, and at 0.27 mA in the sixth comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained.

FOURTH EXAMPLE

As a fourth example of the present invention, the magnetoresistive effect element 1A according to the first modification of the second embodiment shown in FIG. 10 and the magnetoresistive effect element according to the first modification of the fourth embodiment shown in FIG. 19 are fabricated respectively as a seventh sample and an eighth sample. As a comparative example, a magnetoresistive effect element having a structure shown in FIG. 27 is fabricated. In addition, in the magnetoresistive effect element having the structure shown in FIG. 28, the first magnetization pinned layer 6 is formed as a three-layer structure represented as a magnetic layer/a non-magnetic layer/a magnetic layer and the second magnetization pinned layer 15 is formed as a five-layer structure represented as a magnetic layer/a non-magnetic layer/a magnetic layer/a non-magnetic layer/a magnetic layer. In this way, an eighth comparative sample is fabricated. These samples are compared in terms of the spin inversion current. Sections of the fabricated magnetoresistive effect elements shown in FIG. 10 and FIG. 19 are observed using a TEM. As a result, it is found that the dielectric is not formed as far as 1 nm from the top of the magnetic recording layer as shown in FIG. 13 and FIG. 22 and the non-magnetic layer is not divided completely by the dielectric, but a part of the non-magnetic layer is divided (on the second magnetization pinned layer side).

As to the structure of the magnetoresistive effect element according to the fourth example, its manufacturing method is the same as that in the second example.

As the seventh sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer/a non-magnetic layer/a magnetic layer/an antiferromagnetic layer/a cap layer formed of Ru (not illustrated)/a metal hard mask is formed on a lower electrode (not illustrated) provided on a substrate, as shown in FIG. 10.

As the eighth sample, a TMR film, i.e., a laminated film including an underlying layer/an antiferromagnetic layer/a magnetic layer/a non-magnetic layer/a magnetic layer/a tunnel barrier layer/a magnetic layer/a non-magnetic metal layer divided by a dielectric/a magnetic layer/a non-magnetic layer/a magnetic layer/a non-magnetic layer/a magnetic layer/an antiferromagnetic layer/a cap layer formed of Ru (not illustrated)/a metal hard mask is formed on a lower electrode (not illustrated) as shown in FIG. 19.

In the present example, all of lower wiring is formed of Ta/Cu/Ta and all of the underlying layer is formed of Ru. In the TMR film of the seventh sample, PtMn (14 nm) is used as the antiferromagnetic layer, $Co_{70}Fe_{30}$ (4 nm)/Ru (0.85 nm)/$(Co_{70}Fe_{30})_{80}B_{20}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, an Ru layer having a thickness of approximately 1 nm is used, AlOx is used as the dielectric, an Ru layer (4 nm) divided by the dielectric is used, $Co_{70}Fe_{30}$ (4 nm)/Ru (0.85 nm)/$Co_{70}Fe_{30}$ (3 nm) is used as the second magnetization pinned layer, and PtMn (14 nm) is used as the antiferromagnetic layer in order from the bottom. In the seventh sample, the Ru layer having the thickness of approximately 1 nm and the Ru layer (4 nm) serving as the non-magnetic metal layer divided by the dielectric constitute the non-magnetic metal layer.

In the TMR film of the eighth sample, PtMn (14 nm) is used as the antiferromagnetic layer, $Co_{70}Fe_{30}$ (3 nm)/Ru (0.85 nm)/$(Co_{70}Fe_{30})_{80}B_{20}$ (4 nm) is used as the first magnetization pinned layer, MgO (1.0 nm) is used as the tunnel barrier layer, $(Co_{70}Fe_{30})_{80}B_{20}$ (3 nm) is used as the magnetic recording layer, a thin Au layer having a thickness of approximately 1 nm is used, AlOx (0.7 nm) is used as the dielectric, an Au layer (4 nm) divided by the dielectric is used, $Co_{70}Fe_{30}$ (4 nm)/Ru (0.85 nm)/$Co_{70}Fe_{30}$ (3 nm)/Ru (0.85 nm)/$Co_{70}Fe_{30}$ (3 nm) is used as the second magnetization pinned layer, and PtMn (14 nm) is used as the antiferromagnetic layer in order from the bottom. In the eighth sample, the thin Au layer having the thickness of approximately 1 nm and the Au layer (4 nm) divided by the dielectric constitute the non-magnetic metal layer.

AlOx (0.7 nm) used as the dielectric layer which divides the non-magnetic metal layer is fabricated by using a patterned self-aligned process. Its fabrication method is nearly the same as that in the second example.

Both the fourth example and the comparative example have a junction size of 0.1×0.18 μm². After the fabrication, a magnetic field is applied to the long axis direction of the magnetic layer at 350° C. in order to conduct annealing in the magnetic field.

A 200 nm pulse current is applied to the seventh sample, the seventh comparative sample, the eighth sample, and the eighth comparative sample, and a current (mA) at which the spin is inverted is checked. As a result, the spin is inverted at 0.063 mA in the seventh sample, at 0.22 mA in the seventh comparative sample, at 0.06 mA in the eighth sample, and at 0.26 mA in the eighth comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained. On the basis of the present example, it is made clear that the current can be reduced without a problem even if a non-magnetic metal layer having a thickness of approximately 1 nm is not divided.

According to the embodiments of the present invention, it is possible to provide a highly reliable magnetoresistive effect element that operates with low power consumption and low current writing and without element destruction as heretofore described.

Heretofore, embodiments of the present invention have been described with reference to concrete examples. However, the present invention is not limited to these concrete examples. For example, concrete materials of the ferromagnetic substance layer, insulation film, antiferromagnetic substance layer, non-magnetic metal layer and electrode included in the magnetoresistive effect element, and the layer thickness, shape and dimension that can be suitably selected by those skilled in the art to execute the present invention and obtain similar effects are also incorporated in the scope of the present invention.

In the same way, the structure, material quality, shape and dimension of elements included in the magnetic memory of the present invention that can be suitably selected by those skilled in the art to execute the present invention in the same way and obtain similar effects are also incorporated in the scope of the present invention.

All magnetic memories that can be suitably changed in design and executed by those skilled in the art on the basis of the magnetic memories described above as embodiments of the present invention also belong to the scope of the present invention in the same way.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive effect element comprising:
    a first magnetic layer which comprises at least one magnetic film and in which a magnetization direction is fixed;
    a magnetization free layer in which a magnetization direction is changeable;
    a tunnel barrier layer provided between the first magnetic layer and the magnetization free layer;
    a non-magnetic metal layer provided on an opposite surface of the magnetization free layer from the tunnel barrier layer, and including a first region and a second region other than the first region in an opposite surface from the magnetization free layer, a surface of the first region being nearer to the magnetization free layer than a surface of the second region;
    a dielectric layer provided on the first region of the non-magnetic metal layer; and
    a second magnetic layer which comprises at least one magnetic film and in which a magnetization direction is fixed, the second magnetic layer being provided so as to cover a second region of the non-magnetic metal layer and the dielectric layer.

2. The magnetoresistive effect element according to claim 1, wherein
    a magnetization direction of a magnetic film included in the first magnetic layer and located nearest to the magnetization free layer is substantially parallel to a magnetization direction of a magnetic film included in the second magnetic layer and located nearest to the magnetization free layer, and
    the non-magnetic metal layer comprises Ru, Ir, Os or an alloy of them.

3. The magnetoresistive effect element according to claim 1, wherein
    a magnetization direction of a magnetic film included in the first magnetic layer and located nearest to the magnetization free layer is substantially antiparallel to a magnetization direction of a magnetic film included in the second magnetic layer and located nearest to the magnetization free layer, and
    the non-magnetic metal layer comprises Cu, Ag, Au, Rh, Ir, or an alloy of them.

4. The magnetoresistive effect element according to claim 1, wherein the dielectric layer and the tunnel barrier layer comprises $Al_2O_3$, $SiO_2$, MgO, AlN, SiON, or AlON.

5. The magnetoresistive effect element according to claim 1, wherein at least one of the first and second magnetic layers comprises a magnetic film/a non-magnetic film/a magnetic film, or comprises a magnetic film/a non-magnetic film/a magnetic film/a non-magnetic film/a magnetic film.

* * * * *